US010770479B2

(12) United States Patent
Smith et al.

(10) Patent No.: US 10,770,479 B2
(45) Date of Patent: Sep. 8, 2020

(54) THREE-DIMENSIONAL DEVICE AND METHOD OF FORMING THE SAME

(71) Applicant: TOKYO ELECTRON LIMITED, Tokyo (JP)

(72) Inventors: Jeffrey Smith, Clifton Park, NY (US); Anton deVilliers, Clifton Park, NY (US); Kandabara Tapily, Mechanicville, NY (US); Jodi Grzeskowiak, Cuddebackville, NY (US); Kai-Hung Yu, Watervliet, NY (US)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/357,893

(22) Filed: Mar. 19, 2019

(65) Prior Publication Data
US 2019/0288004 A1    Sep. 19, 2019

Related U.S. Application Data

(60) Provisional application No. 62/645,102, filed on Mar. 19, 2018.

(51) Int. Cl.
*H01L 27/118* (2006.01)
*H01L 21/822* (2006.01)
(Continued)

(52) U.S. Cl.
CPC .. *H01L 27/11807* (2013.01); *H01L 21/76807* (2013.01); *H01L 21/8221* (2013.01);
(Continued)

(58) Field of Classification Search
CPC ......... H01L 21/823871; H01L 21/8221; H01L 23/535; H01L 23/5286; H01L 23/5226;
(Continued)

(56) References Cited

U.S. PATENT DOCUMENTS 9,012,284 B2   4/2015  Glass et al.
9,123,567 B2   9/2015  Radosavljevic et al.
(Continued)

OTHER PUBLICATIONS

International Search Report and Written Opinion dated Jun. 28, 2019 in PCT/US2019/022977, 12 pages.

*Primary Examiner* — Hsien Ming Lee
(74) *Attorney, Agent, or Firm* — Oblon, McClelland, Maier & Neustadt, L.L.P.

(57) ABSTRACT

A semiconductor device includes a plurality of first sources/drains and a plurality of first source/drain (S/D) contacts formed over the first sources/drains. The device also includes a plurality of first dielectric caps. Each of the plurality of first dielectric caps is positioned over a respective first S/D contact to cover a top portion and at least a part of side portions of the respective first S/D contact. The device also includes a plurality of second sources/drains and a plurality of second S/D contacts that are staggered over the plurality of first S/D contacts so as to form a stair-case configuration. A plurality of second dielectric caps are formed over the plurality of second S/D contacts. Each of the plurality of second dielectric caps is positioned over a respective second S/D contact to cover a top portion and at least a part of side portions of the respective second S/D contact.

20 Claims, 26 Drawing Sheets

(51) Int. Cl.
*H01L 21/8238* (2006.01)
*H01L 27/02* (2006.01)
*H01L 21/768* (2006.01)

(52) U.S. Cl.
CPC .. *H01L 21/823871* (2013.01); *H01L 27/0207* (2013.01); *H01L 2027/11861* (2013.01); *H01L 2027/11862* (2013.01); *H01L 2027/11875* (2013.01); *H01L 2027/11881* (2013.01)

(58) Field of Classification Search
CPC ............ H01L 27/11807; H01L 27/092; H01L 27/0688; H01L 27/0207; H01L 2027/11881; H01L 2027/11862; H01L 2027/11875
See application file for complete search history.

(56) References Cited

U.S. PATENT DOCUMENTS

| | | | |
|---|---|---|---|
| 9,224,810 B2 | 12/2015 | Kim et al. | |
| 9,343,559 B2 | 5/2016 | Glass et al. | |
| 9,362,181 B1 | 6/2016 | Xie et al. | |
| 9,583,491 B2 | 2/2017 | Kim et al. | |
| 9,595,525 B2 | 3/2017 | Cheng et al. | |
| 9,647,112 B1* | 5/2017 | Balakrishnan | H01L 29/7845 |
| 9,666,492 B2 | 5/2017 | Radosavljevic et al. | |
| 9,761,726 B1* | 9/2017 | Balakrishnan | H01L 29/78642 |
| 9,812,524 B2 | 11/2017 | Glass et al. | |
| 9,859,369 B2 | 1/2018 | Cheng et al. | |
| 9,997,598 B2 | 6/2018 | Smith et al. | |
| 10,074,573 B2 | 9/2018 | Kim et al. | |
| 2013/0161756 A1 | 6/2013 | Glass et al. | |
| 2013/0270512 A1 | 10/2013 | Radosavljevic et al. | |
| 2014/0197377 A1 | 7/2014 | Kim et al. | |
| 2015/0228652 A1 | 8/2015 | Cheng et al. | |
| 2015/0228772 A1 | 8/2015 | Glass et al. | |
| 2015/0325481 A1 | 11/2015 | Radosavljevic et al. | |
| 2016/0086951 A1 | 3/2016 | Kim et al. | |
| 2016/0163604 A1 | 6/2016 | Xie et al. | |
| 2016/0260802 A1 | 9/2016 | Glass et al. | |
| 2017/0133277 A1 | 5/2017 | Kim et al. | |
| 2017/0186841 A1 | 6/2017 | Cheng et al. | |
| 2017/0229354 A1 | 8/2017 | Radosavljevic et al. | |
| 2018/0026042 A1 | 1/2018 | Smith et al. | |
| 2018/0040695 A1 | 2/2018 | Smith et al. | |
| 2018/0047832 A1 | 2/2018 | Tapily et al. | |
| 2018/0240802 A1 | 8/2018 | Smith et al. | |

* cited by examiner

THREE-DIMENSIONAL DEVICE AND METHOD OF FORMING THE SAME

CROSS REFERENCE TO RELATED APPLICATIONS

This application claims the benefit of U.S. Provisional Application No. 62/645,102 filed Mar. 19, 2018, the entire contents of which is incorporated herein by reference.

FIELD OF THE INVENTION

The invention relates to semiconductor micro fabrication including systems and processes for patterning, deposition, and removal of materials on a given substrate or wafer.

BACKGROUND

Present disclosure relates to a method of manufacturing a semiconductor device such as an integrated circuit and transistors and transistor components for an integrated circuit. In the manufacture of a semiconductor device (especially on the microscopic scale), various fabrication processes are executed such as film-forming depositions, etch mask creation, patterning, material etching and removal, as well as doping treatments, are performed repeatedly to form desired semiconductor device elements on a substrate. Historically, with microfabrication, transistors have been created in one plane, with wiring/metallization formed above, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor devices in which transistors are stacked on top of each other.

Techniques disclosed in the present disclosure facilitate manufacturing of 3D semiconductor circuits by providing self-alignment techniques for creating multi-tiered (stair-cased) source/drain contacts in three-dimensional logic devices.

It should be noted that an order of different manufacturing steps as described herein is presented for clarity sake. In general, these steps can be performed in any suitable order. Additionally, although each of the different features, techniques, configurations, etc. herein may be discussed in different places of the present disclosure, it is intended that each of the concepts can be executed independently from each other or in combination with each other. Accordingly, the present disclosure can be embodied and viewed in many different ways.

It should be understood that the summary section does not specify every embodiment and/or incrementally novel aspect of the present disclosure or claimed invention. Instead, the summary only provides a preliminary discussion of different embodiments and corresponding points of novelty over conventional techniques. Additional details and/or possible perspectives of the disclosure and embodiments should be directed to the Detailed Description section and corresponding figures of the present disclosure as further discussed below.

SUMMARY

The present disclosure incorporates a complementary field-effect transistor (CFET) device in which some or all of the NMOS or PMOS source and drain electrodes/contacts are vertically stacked over one another in the CFET design. The individual NMOS and PMOS source and drain (S/D) electrodes (contacts) are staggered or stair-cased with respect to one another so that an access to either an NMOS S/D contact or a PMOS S/D contact is feasible by some of the routing tracks (i.e., routing metal lines) in the BEOL. By introducing such a staggering or stair-case configuration of the NMOS and PMOS S/D electrodes (contacts), an access to a common routing track in the BEOL can be provided. Accordingly, any via-to-drain connecting from an upper metal layer can access either an upper or lower S/D electrode (contact).

The present disclosure includes a method of creating a self-aligned connection between a via-to-drain structure and a tiered S/D contact (i.e., a tired NMOS S/D contact and PMOS S/D contact). The method prevents the via-to-drain structure from unintentionally shorting any of other tiered S/D contacts. Due to physical cell height limitations, the staggering nature of the stacked upper and lower S/D contacts, and the limited contacting area of the lower S/D contacts, the via-to-drain structure that connects between a BEOL metal line and a target S/D contact can be easily short with an adjacent tiered S/D contacts. The present disclosure provides a novel structure that guild the via-to-source structure to be self-aligned to the target S/D contact.

In the present disclosure, two tiered S/D contacts are shown as examples. However, the number of tiered S/D contacts in a given standard cell can exceed the two. For example, in a case of 6T SRAM standard cell, three stacked S/D electrodes are introduced. Note that "standard cell" used herein is not equivalent with "conventional," but refers to a group or unit of devices and interconnects that provide a given logic function. Accordingly, standard cells disclosed herein are new.

According to an aspect of the disclosure, a semiconductor device is provided. The semiconductor device includes a plurality of first source/drain (S/D) contacts and a plurality of first sources/drains. Each of the plurality of first S/D contacts is formed over a respective first source/drain, and has a bar shape with a top portion, a bottom portion and side portions so that the bottom portion covers the respective first source/drain. The semiconductor device also includes a plurality of first dielectric caps formed over the plurality of first S/D contacts. Each of the plurality of first dielectric caps is positioned over a respective first S/D contact to cover the top portion and at least a part of the side portions of the respective first S/D contact.

In the disclosed device, a plurality of second S/D contacts and a plurality of second sources/drains are positioned over the plurality of first S/D contacts so as to form a stair-case configuration. Each of the plurality of second S/D contacts is formed over a respective second S/D, and has a bar shape with a top portion, a bottom portion and side portions so that the bottom portion covers the respective second source/drain. The device further includes a plurality of second dielectric caps formed over the plurality of second S/D contacts. Each of the plurality of second dielectric caps is positioned over a respective second S/D contact to cover the top portion and at least a part of the side portions of the respective second S/D contact.

In some embodiments, the first dielectric cap can cover the side portions of the first S/D contact fully. Similarly, the second dielectric cap can cover the side portions of the second S/D contact fully.

In some embodiments, the first dielectric cap includes a bottom layer positioned on the top portion of the first S/D contact and a top layer formed over the bottom layer to cover the top portion and the side portions of the first S/D contact. In some embodiments, the second dielectric cap includes a bottom layer positioned on the top portion of the second S/D contact and a top layer formed over the bottom layer to cover the top portion and the side portions of the second S/D contact.

The semiconductor device includes a plurality of power rails that are buried in a substrate and arranged below the plurality of the first S/D contacts so as to form a stair-case configuration. In some embodiments, at least one of the plurality of first S/D contacts is connected to a first power rail of the plurality of power rails through a first via-to-rail structure, and at least one of the plurality of second S/D contacts is connected to a second power rail of the plurality of power rails through a second via-to-rail structure.

The semiconductor device also includes a plurality of third dielectric caps formed over the plurality of power rails. Each of the plurality of third dielectric caps is formed over a respective power rail. Accordingly, the first via-to-rail structure passes through the third dielectric cap, and the second via-to-rail structure passes through the third dielectric cap.

The semiconductor device further includes a plurality of via-to-drain structures. In some embodiments, the plurality of first S/D contacts and the plurality of second S/D contacts are stair-cased so that at least one of the plurality of via-to-drain structures passes through the first dielectric cap to connect to one of the plurality of first S/D contacts, and at least another one of the plurality of via-to-drain structures passes through the second dielectric cap to connect to one of the plurality of second S/D contacts. The semiconductor device also has a plurality of metal lines. The plurality of the metal lines are electrically coupled with the plurality of via-to-drain structures.

In some embodiments, each of the plurality of first dielectric caps is configured to separate the respective first S/D contact from at least one of an adjacent first S/D contact, an adjacent via-to-drain structure, an adjacent first via-to-rail structure, and an adjacent second via-to-rail structure. In some embodiments, each of the plurality of second dielectric caps is configured to separate the respective second S/D contact from at least one of an adjacent second S/D contact, an adjacent via-to-drain structure, and an adjacent second via-to-rail structure.

The semiconductor device further includes a first channel region formed along a length direction of the power rail, a second channel region formed along the length direction of the power rail, and a plurality of gate structures. In some embodiments, the plurality of gate structures surround the first channel region and the second channel region. Further, the plurality of first sources/drains surround the first channel structure, and the plurality of second sources/drains surround the second channel structure. The plurality of gate structures and the plurality of first sources/drains are spaced apart from each other by a plurality of low-K spacers, and disposed alternatively, and the plurality of gate structures and the plurality of second sources/drains are spaced apart from each other by the plurality of low-K spacers, and disposed alternatively.

According to another aspect of the disclosure, a method for manufacturing a semiconductor device is provided. In the disclosed method, a semiconductor structure is formed. The semiconductor structure includes a first channel structure, a second channel structure, and a plurality of power rails that are buried in a substrate. The plurality of power rails is positioned below the first channel structure to form a stair-case configuration, and the second channel structure is formed over the first channel structure. The first and second channel structures extend along a length direction of the plurality of power rails.

Subsequently, a plurality of first sources/drains are formed to surround the first channel structure, and are embedded in a first dielectric layer. Further, a plurality of first source/drain (S/D) contacts are formed so that each of the plurality of first S/D contacts is formed over a respective first source/drain. Each of the plurality of first S/D contacts has a bar shape with a top portion, a bottom portion and side portions so that the bottom portion covers the respective first source/drain.

In the disclosed method, a plurality of first dielectric caps are formed over the plurality of first S/D contacts. Each of the plurality of first dielectric caps is positioned over a respective first S/D contact to cover the top portion and at least a part of the side portions of the respective first S/D contact. Further, a plurality of second sources/drains are formed. The plurality of second sources/drains are positioned over the plurality of first sources/drains, surround the second channel structure, and are embedded in a second dielectric layer.

Subsequently, a plurality of second source/drain (S/D) contacts are formed so that each of the plurality of second S/D contacts is disposed over a respective second source/drain. Each of the plurality of second S/D contacts has a bar shape with a top portion, a bottom portion and side portions so that the bottom portion covers the respective second source/drain. The plurality of second S/D contacts are staggered over the plurality of first S/D contacts to form a stair-case configuration.

Further, a plurality of second dielectric caps are formed over the plurality of second S/D contacts. Each of the plurality of second dielectric caps is positioned over a respective second S/D contact to cover the top portion and at least a part of the side portions of the respective second S/D contact.

In yet another embodiment, a semiconductor device is provided. The semiconductor device includes a substrate, a plurality of power rails buried in the substrate, and a plurality of first sources/drains formed over the plurality of power rails. In the disclosed device, a plurality of first source/drain (S/D) contacts are formed over the plurality of first sources/drains. Each of the plurality of first S/D contacts is formed over a respective first source/drain, and has a bar shape with a top portion, a bottom portion and side portions so that the bottom portion covers the respective first source/drain.

The semiconductor device also includes a plurality of first dielectric caps formed over the plurality of first S/D contacts. Each of the plurality of first dielectric caps is positioned over a respective first S/D contact to cover the top portion and at least a part of the side portions of the respective first S/D contact so as to separate the respective first S/D contact from at least one of an adjacent first S/D contact, an adjacent via-to-drain structure, an adjacent first via-to-rail structure, and an adjacent second via-to-rail structure.

In the disclosed semiconductor device, a plurality of second sources/drains are formed over the plurality of first sources/drains to form a stair-case configuration. Further, a plurality of second source/drain (S/D) contacts are formed over the plurality of second sources/drains. Each of the plurality of second S/D contacts is formed over a respective second source/drain, and has a bar shape with a top portion, a bottom portion and side portions so that the bottom portion covers the respective second source/drain.

The semiconductor device further includes a plurality of second dielectric caps formed over the plurality of second S/D contacts. Each of the plurality of second dielectric caps is positioned over a respective second S/D contact to cover the top portion and at least a part of the side portions of the respective second S/D contact so as to separate the respective second S/D contact from at least one of an adjacent second S/D contact, an adjacent via-to-drain structure, and an adjacent second via-to-rail structure.

In the disclosed device, at least one of the plurality of first S/D contacts is connected to a first power rail of the plurality of power rails through a first via-to-rail structure, and at least one of the plurality of second S/D contacts is connected to a second power rail of the plurality of power rails through a second via-to-rail structure.

Comparing to related examples, the disclosed semiconductor device gains several advantages. Firstly, by staggering the NMOS S/D contacts, the PMOS S/D contacts, and the power rails in the stair-case configuration, a total area of the semiconductor device can be reduced while accesses to routing tracks (metal lines) of the BOEL can be provided. Secondly, by introducing the dielectric cap on the side portions (lateral faces) of the S/D contact, a self-alignment pattern of the via-to-drain structure or the via-to-rail structure onto a target S/D contact or a target power rail can be achieved during manufacturing through an establishment of a selective etch, where the dielectric cap positioned on the side portions of the S/D contact can have different etch selectivity to the dielectric layer used to situate the S/D contact, as well as etch selectivity to a dielectric cap over a metal gate and a low-k gate spacer. Thirdly, the introduced dielectric cap on the top portion and the side portions of the S/D contact can effectively reduce a parasitic capacitance between a S/D contact and an adjacent contact, or between a S/D contact and an adjacent via-to-drain structure, or between a S/D contact and an adjacent via-to-rail structure.

The foregoing paragraphs have been provided by way of general introduction, and are not intended to limit the scope of the following claims. The described embodiment, together with further advantages, will be best understood by reference to the following detailed description taken in conjunction with the accompanying drawings.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
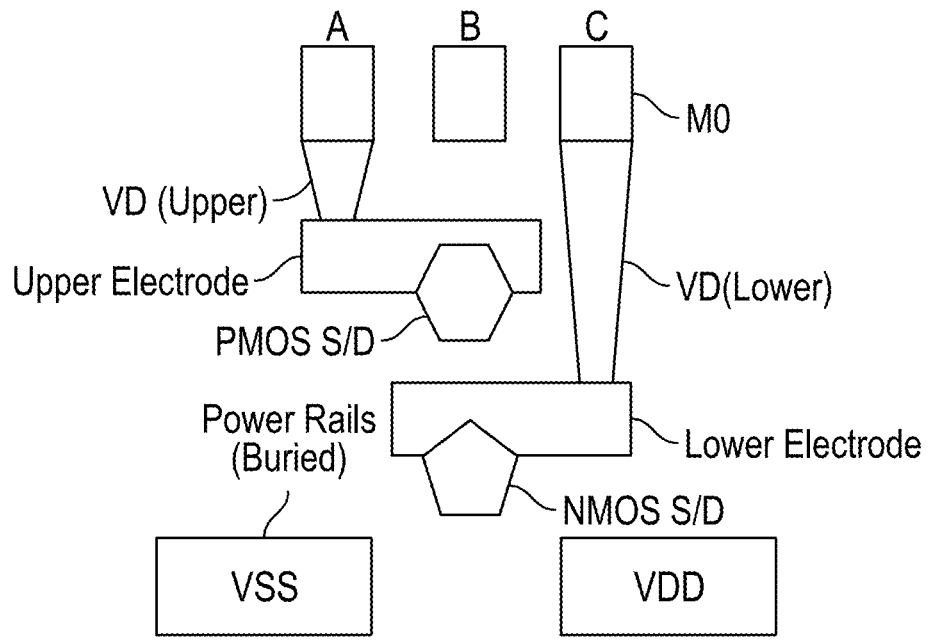
FIG. 1A is a schematic view of a semiconductor device in a stair-case configuration, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the apparatus in use or operation in addition to the orientation depicted in the figures. The apparatus may be otherwise oriented (rotated 90 degrees or at other orientations) and the spatially relative descriptors used herein may likewise be interpreted accordingly.

Reference throughout the specification to "one embodiment" or "an embodiment" means that a particular feature, structure, material, or characteristic described in connection with the embodiment is included in at least one embodiment, but do not denote that they are present in every embodiment. Thus, the appearances of the phrases "in one embodiment" in various places through the specification are not necessarily referring to the same embodiment. Furthermore, the particular features, structures, materials, or characteristics may be combined in any suitable manner in one or more embodiments.

The present disclosure includes circuit designs and corresponding methods of manufacture within a 3D device, such as a complementary FET (field-effect transistor) device. Complementary FET devices (CFET) are three-dimensionally stacked logic standard cells in which either NMOS or PMOS is positioned over its complement. Such a structure enables an area-scaling and routing congestion improvement for logic standard cells through "folding" the logic cell onto itself.

Complementary FET provides a benefit of area scaling by distributing an NMOS S/D, a PMOS S/D, and a gate from a lateral configuration to a stacked configuration. Another enabling benefit of complementary FET logic standard cells is that the S/D contacts can be staggered or stair-cased in order to enable an access to either a lower or an upper S/D contact from a common routing line. Such a stair-case configuration replaces a need for additional metallization to create an nFET to pFET crossing because the stair-case configuration is able to be implemented internally within the device.

Figure 1B:
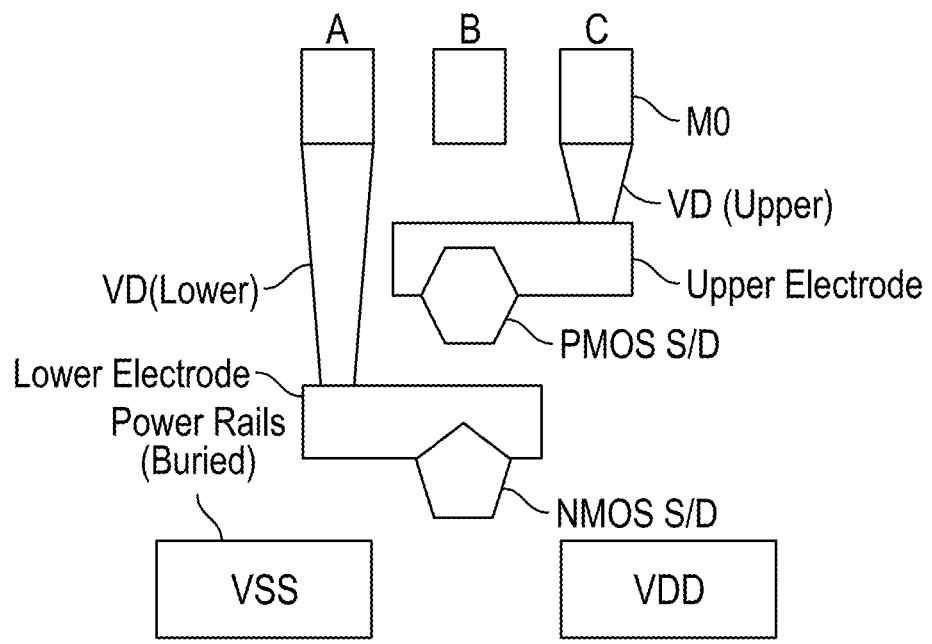
FIG. 1B is another schematic view of a semiconductor device in a stair-case configuration, in accordance with some embodiments.

FIGS. 1A and 1B are schematic views of a semiconductor device in a stair-case configuration. FIG. 1A can be a representation of stair-case connections of a metal layer (i.e., M0) to both lower and upper electrodes (or S/D contacts) in a CFET device. FIG. 1B provides another representation of stair-case connections of a metal layer (i.e., M0) to both lower and upper electrodes (or S/D contacts) in the CFET device. In an embodiment of FIGS. 1A and 1B, the lower electrodes can be NMOS S/D contacts that are formed over the NMOS sources/drains, and the top electrodes can be PMOS S/D contacts that are positioned over the PMOS sources/drains. One of the benefits of the CFET device is that any outer metal tracks (i.e., element A, B or C) can make contact to either a NMOS or a PMOS S/D contact based on a way that the contacts are staggered relative to one another within the CFET device. Each of internal via-to-drain structures (i.e., VD (lower) or VD (upper)) preferably only makes connection to a respective target S/D contact and any pattern misplacement can result in the VD (lower) making contact with the upper S/D electrode.

The staggered nature of the upper and lower S/D drain contacts (or electrodes) enables an internal routing nature of the CFET device because a metal routing line (i.e., M0 in FIG. 1) can makes a connection to either NMOS or PMOS S/D contacts. Comparing to the CFET device, a related example, such as a FINFET device, may require an additional metal layer to make the NMOS-to-PMOS connection within a standard cell. Therefore the staggered nature of the upper and lower S/D drain contacts further reduces the metal congestion.

However, the staggered configuration of the S/D contacts presents a challenge for making accurate via-to-drain (VD) connections between the metal routing tracks (or routing lines) and the upper and lower S/D contacts. Any misalignment between a metal routing track and a lower S/D contact can result in an unintentional connection to the upper S/D contact, thereby making a connection to a PMOS S/D instead of connecting to a NMOS S/D as designed. Even a partial misalignment can have significant ramifications. For example, as shown in FIG. 1, if a via-to-drain structure, such as the VD (upper) in FIG. 1, is designed to make a connection to the upper S/D electrode, but the via-to-drain structure only makes a partial contact with the upper S/D electrode, and further go down along sidewalls of the upper contact to make another partial contact with the lower S/D electrode. Such a misalignment consequently results in a formation of an inverter within the CFET device.

The three-dimensional CFET device gains not only a benefit in a size reduction through the vertical stacking of NMOS and PMOS active areas, but also gains routing benefit that can be realized through the vertical stacking configuration. The routing benefit can provide significant reduction in routing tracks (metal lines) for a corresponding device. In addition, in the disclosed 3D CFET device, a buried power rail structure is provided, where a plurality of power rails (i.e., VSS and VDD in FIG. 1) are buried in a substrate and positioned below the NMOS and PMOS active areas (bury the power rails). The buried power rail structure can provide additional benefits. According to conventional microfabrication techniques, a power rail can be positioned above the NMOS and PMOS active areas and occupy significant space in the BEOL (back end of line). If power rails are positioned in the BEOL of the CFET device, an increased probability of error can be expected. Such a configuration would primarily have 3-track or 4-track cell heights, which means that that there would be very little margin for proper alignment in making connections between routing tracks and the intended (or targeted) S/D electrode.

For example, for a given foundry N5 device (i.e., 5 nm logic device) where the BEOL routing tracks can scale down around a half-pitch of 12 nm, a minimum separation is required between a via-to-drain structure and an adjacent S/D contact to prevent an electric short, and between S/D contacts from adjacent standard cells. The minimum distances can be determined by electrical constraints, and can likewise be as small as several nanometers. Using such dimensions of N5 device means that for a 12 nm via-to-drain structure that is intended to make a contact between a metal routing line (i.e., M0 in FIG. 1) in the BEOL and one of the S/D contacts (i.e., upper electrode, lower electrode in FIG. 1), an edge placement tolerance of less than 3 nm is needed provided that the S/D contacts are making maximum possible access points to the BEOL. When taking process variations of the current lithography process into account, such as overlay control, CD uniformity, pitch walking (if the BEOL routing tracks are defined by any multiple patterning processes), such a 3 nm tolerance is not physically capable across the billions of connections that are needed across an entire wafer. As a consequence, there can be significant yield fall-out from a device manufacturing perspective driven by either the via-to-drain structure (i.e., VD (upper) or VD (lower) in FIG. 1) making connection to an incorrect S/D contact, or the via-to-drain structure inadvertently contacting multiple tiered S/D contacts.

Thus, as identified herein, a method of self-aligning the BEOL metal routing tracks to the correct source and drain contacts is needed for successful device creation. The method of self-alignment includes an ability to guide the via-to-drain structures down to the correct tiered S/D contacts, as well as provide an additionally self-alignment between the S/D contacts and the metal gate caps, and between the S/D contacts and low-k gate spacers. In addition to solving such challenges, the present disclosure can incorporate elements of a self-alignment integration flow. Such a flow can provide fixed or discreet distances between a via-to-drain structure and an adjacent S/D contact, or between the via-to-drain structures and adjacent cells.

Figure 2A:
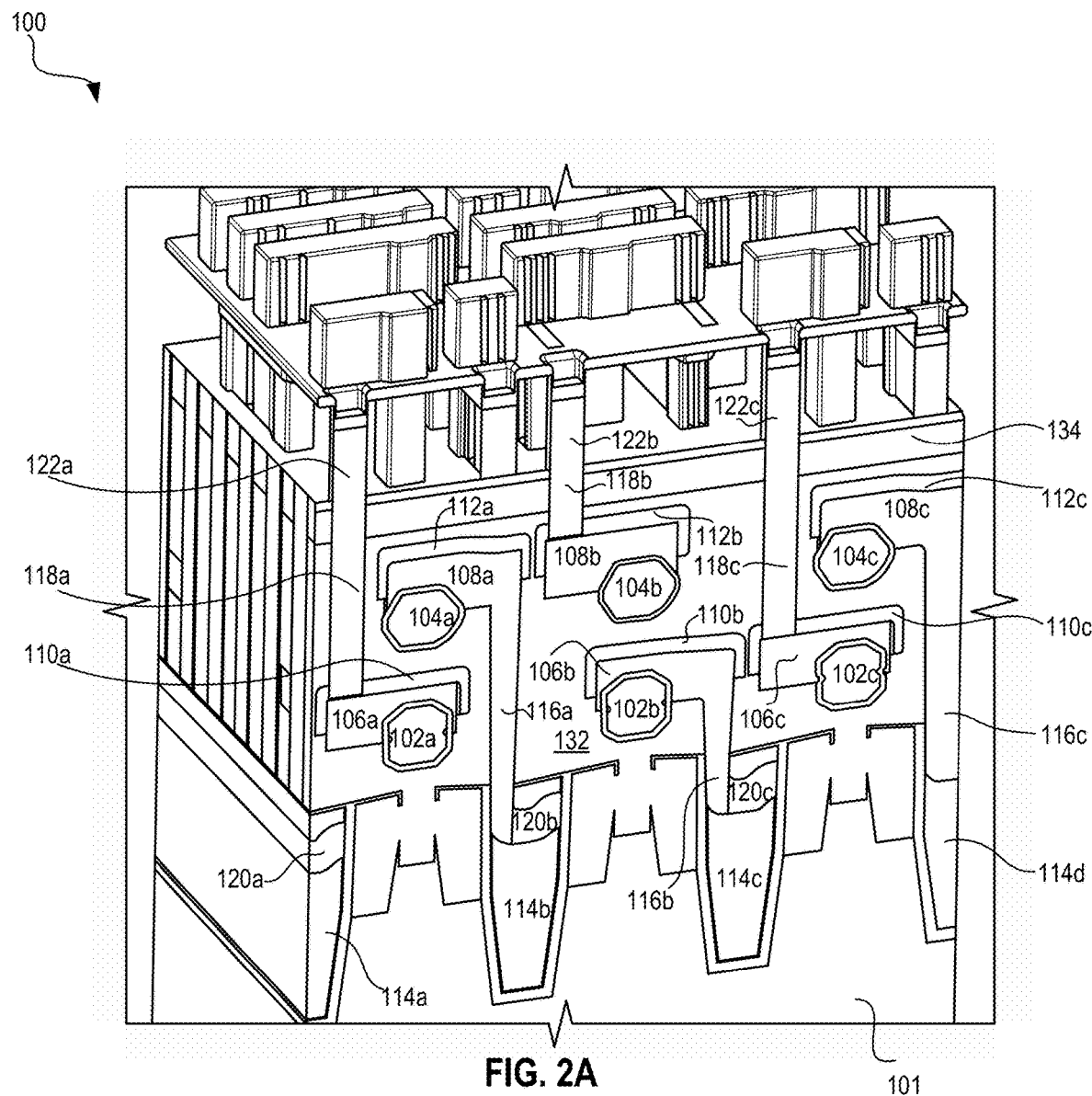
FIG. 2A is a cross-sectional view of a 3D CFET device, in accordance with some embodiments.
Figure 2B:
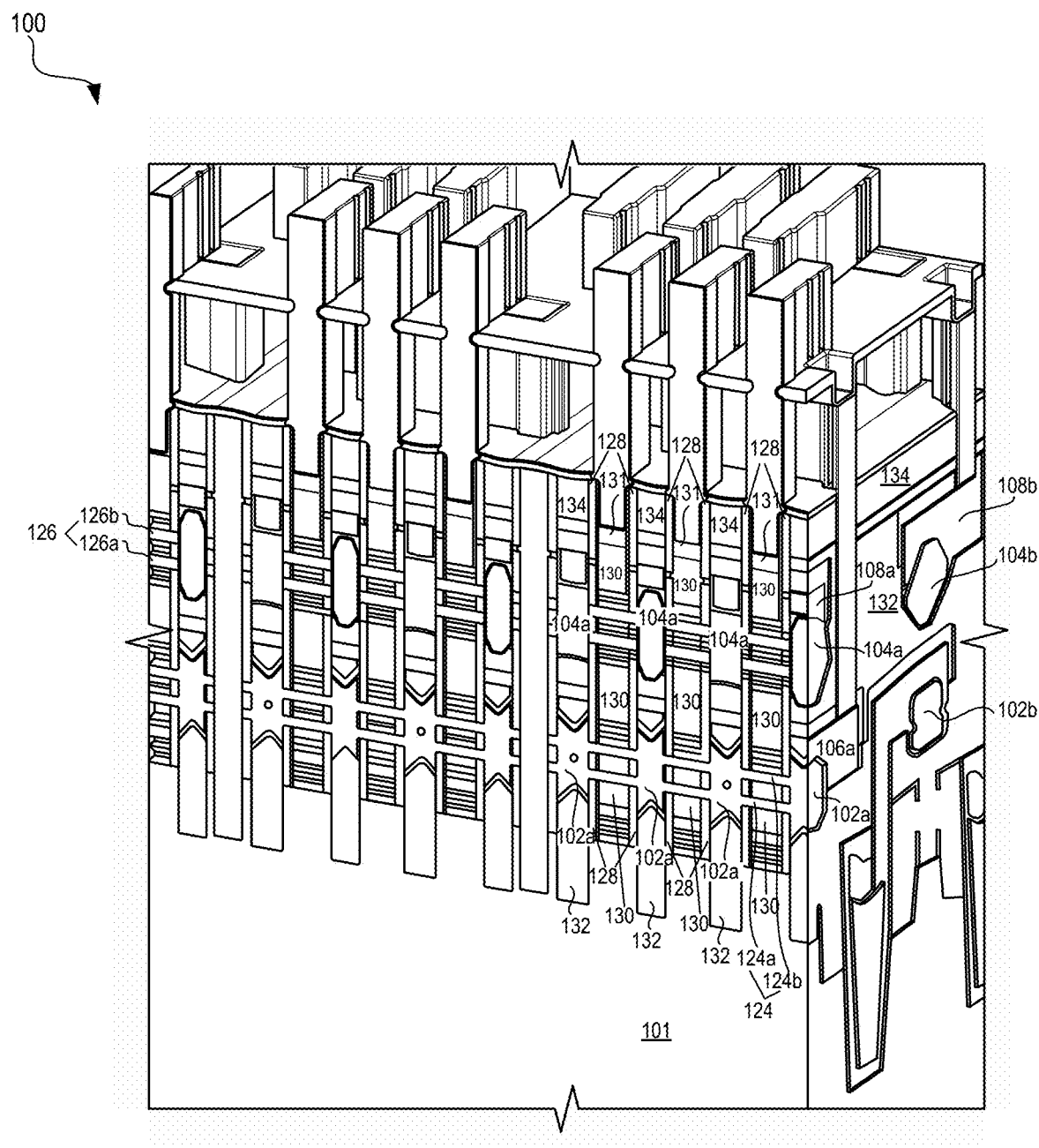
FIG. 2B is another cross-sectional view of the 3D CFET device, in accordance with some embodiments.

FIGS. 2A and 2B are cross-sectional views of a 3D CFET device 100. As shown in FIG. 2A, the device 100 can include a plurality of bottom sources/drains 102a-102c, and a plurality of top sources/drains 104a-104c. The bottom sources/drains 102 and the top sources/drains 104 are disposed in a pre-metal dielectric (PMD) layer 132 and the top sources/drains 104 are staggered over the bottom sources/drains 102. In an embodiment, the bottom sources/drains can be NMOS sources/drains, and the top sources/drains can be PMOS sources/drains. In another embodiment, the bottom sources/drains can be PMOS sources/drains, and the top sources/drains can be NMOS sources/drains based on circuit design. The device 100 can include a plurality of bottom S/D contacts 106a-106c, and a plurality of top S/D contacts 108a-108c. The plurality of top S/D contacts are staggered over the plurality of bottom S/D contacts to form a stair-case configuration. The top S/D contacts and the bottom S/D contacts can be made of tungsten, cobalt, copper, ruthenium, or the like. Each of the bottom S/D contacts 106 is formed over a respective bottom source/drain 102, and can have a top portion, a bottom portion and side portions (lateral faces) so that the bottom portion covers the respective bottom source/drain 102. For example, as shown in FIG. 2A, a bottom S/D contact 106a is formed over a bottom S/D 102a, and the bottom portion of the bottom S/D contact 106a covers the bottom S/D 102a. Similarly, each of the top S/D contacts 108 is formed over a respective top source/drain 104, and can have a top portion, a bottom portion and side portions (lateral faces) so that the bottom portion covers the respective top source/drain.

The device 100 can include a plurality of bottom dielectric caps 110a-110c formed over the plurality of bottom S/D contacts 106a-106c. Each of the bottom dielectric caps is positioned over a respective bottom S/D contact to cover the top portion and at least a part of the side portions of the respective bottom S/D contact. For example, as shown in FIG. 2A, a bottom dielectric cap 110a is disposed over the bottom S/D contact 106a. The bottom dielectric cap 110a covers the top portion and at least a part of the side portions of the bottom S/D contact 106a. The device 100 can also include a plurality of top dielectric caps 112a-112c formed over the plurality of top S/D contacts 108a-108c. Each of the top dielectric caps can be positioned over a respective top S/D contact to cover the top portion and at least a part of the side portions of the respective top S/D contact. For example, as shown in FIG. 2A, a top dielectric cap 112a is disposed over the top S/D contact 108a. The top dielectric cap 112a covers the top portion and a part of the side portions of the top S/D contact 108a.

The device 100 also includes a plurality of power rails 114a-114d that are formed below the plurality of bottom S/D contacts and buried in a substrate 101. The power rails 114 and the bottom sources/drains 102 can also be staggered in a stair-case configuration. The power rails can be a VDD or a VSS that is illustrated in FIGS. 1A-1B. In addition, a plurality of via-to-rail structures can be included in the device 100. For examples, two via-to-rail structures 116a-116b are illustrated in FIG. 2A. The via-to-rail structures are configured to connect the top or bottom S/D contacts and the power rails. For example, as shown in FIG. 2A, a via-to-rail structure 116a connects the top S/D contact 108a and a power rail 114b. A via-to-rail structure 116b connects a bottom S/D contact 106b and a power rail 114c. The device 100 can include a plurality of rail dielectric caps 120a-120c that are formed over the power rails 114. As shown in FIG. 2A, each of the rail dielectric caps can disposed on a respective power rail. For example, a rail dielectric cap 120b is formed over the power rail 114b. In addition, as shown in FIG. 2A, the via-to-rail structures can pass through the rail dielectric caps to connect to the power rails.

The device 100 can includes a plurality of via-to-drain structures 118a-118c. The via-to-drain structures are configured to connect the bottom or top S/D contacts and initial metal layers (i.e., M0 layer in FIGS. 1A and 1B) 122a-122c. For example, a via-to-drain structure 118a connects the bottom S/D contact 106a and an initial metal layer 122a, and a via-to-drain structure 118b connects the top S/D contact 108b and an initial metal layer 122b. It should be noted that the via-to-drain structures can pass through the bottom or top dielectric caps to connect to the bottom or top S/D contacts respectively. For example, the via-to-drain structure 118a can pass through the bottom dielectric cap 110a to connect to the bottom S/D contact 106a.

As shown in FIG. 2A, the tiered S/D contacts 106 and 108, also called electrodes, for the 3D complimentary FET device 100 (also called CFET), can have a bar-shaped structure that is different from S/D contacts of the conventional FINFET devices. The S/D contacts of the conventional FINFET devices are traditionally singular-point vias. Using a bar-shaped S/D contact is beneficial because of the lateral stacking. Based on the NMOS and PMOS S/D contacts laterally stacked over one another, the S/D contact can pull-up or pull-down from a metal track line (i.e., 122a-122C), or tap into a power rail (i.e., 114b, or 114C). Power rails in a CFET device (or other 3D device) herein can either be positioned in the BEOL (such as with conventional FINFET standard cell designs), or the power rails can be buried within the bulk silicon of the device thereby providing significant area scaling benefits through track-height reduction scaling. A given metal S/D contact herein can provide connection to as many metal routing tracks as possible in order to accommodate more flexibility in a corresponding standard cell design. With staggered configurations herein, tiered contacts can be staggered in multiple orientations with respect to one another to provide up to 2 pin connections for the bottom-most S/D metal contact. As mentioned above, "standard cell" used herein is not equivalent with "conventional," but refers to a group or unit of devices and interconnects that provide a given logic function. Accordingly, standard cells disclosed herein are new.

Still referring to FIG. 2A, the NMOS and PMOS S/D contacts are staggered or stair-cased with respect to one another so that an access to either an NMOS S/D contact or a PMOS S/D contact is feasible by some of the routing tracks (i.e., routing metal lines) in the BEOL. By introducing such a staggering or stair-case configuration of the NMOS and PMOS S/D electrodes/contacts, an access to a common routing track in the BEOL can be provided. Accordingly, any via-to-drain connecting from an upper metal layer can access either an upper or lower S/D electrode/contact.

In the disclosed device 100, the dielectric caps that are formed on side portions of the S/D contacts can effectively prevent the S/D contacts from shorting adjacent components. For example, the bottom dielectric cap 110a formed on the side portions of the bottom S/D contact 106a can separate the bottom S/D contact 106a from an adjacent via-to-rail structure 116a. Similarly, the top dielectric cap 112a formed on the side portion of the top S/D contact 108a can prevent the top S/D contact 108a from shorting an adjacent via-to-drain structure 118a, or an adjacent top S/D contact 108b.

The dielectric caps formed on the top portion and the side portions of the S/D contacts can further effectively reduce a parasitic capacitance between a S/D contact and an adjacent S/D contact, or between a S/D contact and an adjacent via-to-drain structure, or between a S/D contact and an adjacent via-to-rail structure.

FIG. 2B shows another cross-sectional view of the device 100 from a different cross-sectional position. As shown in FIG. 2B, the device 100 can include a bottom channel region 124. The bottom channel region 124 can further include two nanosheets 124a and 124b. The bottom channel region 124 can be formed along a length direction of the power rails 114 and protrude through a plurality of low-k gate spacers 128. The device 100 can also have a top channel region 126. The top channel region 126 can include two nanosheets 126a and 126b. In an embodiment, the bottom channel region can be a NMOS channel region, and the top channel region can be a PMOS channel region. In another embodiment, the bottom channel region can be a PMOS channel region and the top channel region can be a NMOS channel region according to a circuit design. In some embodiments, the bottom and top channel regions can include nanowires, nanosheets, or nanorings.

Still referring to FIG. 2B, the device 100 can have a plurality of gate structures 130. As shown in FIG. 2B, the plurality of gate structures 130 can surround the bottom channel region 124 and the top channel region 126. A plurality of gate dielectric caps 131 can be formed over the plurality of gate structures 130 and positioned between two low-k gate spacers 128. In FIG. 2B, a plurality of S/D regions can be formed between the low-k gate spacers 128. The S/D regions can include the bottom and top sources/drains 102 and 104. The S/D regions and the gate structures 130 are disposed alternatively and spaced apart from one another by the low-k gate spacers 128. Further, in the S/D regions, the plurality of bottom sources/drains 102a surround the bottom channel region 124 and the plurality of top sources/drains 104a surround the top channel region 126.

As shown in FIG. 2A, the plurality of gate structures 130 and the plurality of bottom sources/drains 102a are spaced apart from each other by the plurality of low-k gate spacers 128, and disposed alternatively. Similarly, the plurality of gate structures 130 and the plurality of top sources/drains 104a are spaced apart from each other by the plurality of low-k gate spacers 128, and disposed alternatively.

In the disclosure, self-alignment can be achieved through etch selectivity and films matrix involving films or caps deposited over each of the tiered S/D contacts, where the dielectric caps (i.e., 110 and 112 in FIG. 2A) that are placed over the stacked S/D contacts can have different etch selectivity to the pre-metal dielectric (i.e., 132) that is used to situate these S/D contacts, as well as different etch selectivity to a gate dielectric cap (i.e., 131) over the metal gate (i.e., gate structure 130) and the low-k gate spacer (i.e., 128). In addition, an etch selective cap (i.e., 134) can be used to provide initial etch selectivity among the S/D regions that includes the bottom and top sources/drains and the bottom and top S/D contacts, the gate dielectric caps covering the metal gates, and the low-k gate spacers to enable an initial contact-over-active-gate (COAG) self-alignment strategy.

In the disclosure, in order to selectively deposit the dielectric caps along the side portions of the S/D contacts, the a pre-metal dielectric (i.e., 132) within the S/D region can be recessed after a S/D contact metallization to expose the side portions of the S/D contacts, and the dielectric caps can be subsequently deposited along the vertical side-faces (side portions) of the S/D contacts. The dielectric caps formed along the side portions of the S/D contacts can provide an additional means for self-alignment where adequate dielectric separation can be provided between S/D contacts and adjacent via-to-drain structures.

Selective deposition of dielectric along the lateral faces (side portions) of the S/D contacts can provide a fixed channel within the pre-metal dielectric (PMD) layer 132, which can guide a pattern transfer of any via-to-drain structure or via-to-rail structure in the S/D region. Selective deposition of dielectric cap along the lateral faces of the S/D contact can also provide a fixed distance in an atomic-scale precision through a selective deposition/atomic layer deposition. Such a distance can effectively reduce the parasitic capacitance or electric short associated with an unintended proximity of a via-to-drain structure or a via-to-rail structure to an adjacent S/D contact.

In some embodiments, the bottom and top dielectric caps can include a first layer positioned on the top portion of the S/D contact and a second layer formed over the first layer to cover the top portion and the side portions of the S/D contact. The first layer can be made of metal oxide materials, such as AlO. The first layer can also be made of SiO, SiC, SiN, SiOC, SICN, SiOCN, an organic-based material, or the like. The first layer can further be metal film made of tungsten, ruthenium, cobalt, copper, liner materials containing metals (such as TaN, TiN, Ta, and Ti). The second layer can include SiO, SiC, SiN, SiOC, SICN, SiOCN, an organic-based material, or the like.

In the disclosure, additional self-alignment can also be achieved based on the etch selective cap (i.e., 134), the gate dielectric cap (i.e., 131) of the metal gate, the low-k gate spacer (i.e., 128), and the dielectric material (i.e., PMD 132) used in the general S/D region in which the stacked S/D contacts are situated. The additional self-alignment assists nanofabrication so that any via-to-drain structure can make contact only to the intended (targeted) S/D contact instead of make contact inadvertently to the gate structures 130, or cause any damage to the low-k gate spacers 128, when the pattern of the via-to-drain structure is transferred from a mask pattern to the PMD 132 in the S/D area, and/or when any of the dielectric caps over the S/D contacts is opened to connect the via-to-drain structure during the nanofabrication.

Capping materials used for forming the dielectric cap over the source and drain contacts can be a same material across all S/D contacts or intentionally be of different dielectric materials with different etch selectivity in order to provide better self-alignment. For example, as mentioned above, the dielectric cap can include a first layer and a second layer. The first and second layers can be made of a same material or can be made of different material. If the dielectric cap is optionally used to provide some initial self-alignment between the S/D contacts and the gate dielectric cap over the metal gate (gate structure)/the low-k gate spacer, then the material selection can either be similar to the dielectric caps used over the S/D contacts, or be different in order to further improve the self-alignment capability of the nanofabrication. Similar material selection options can also be applied to the etch selective cap (i.e., 134) to enhance an overall self-alignment.

The formation of the dielectric caps over the S/D contacts can be implemented through multiple methods. In an example, a selective deposition can be applied to deposit the dielectric cap directly on the exposed upper surface (top portion) of the S/D contact. For example, Tokyo Electron has known processes for the selective deposition of dielectric films directly on the surface of conducting materials such as copper, tungsten, cobalt, ruthenium, and alloys thereof. In another example, the dielectric cap positioned directly above the S/D contact can be formed based on a bottom-filled process where the deposition of the dielectric material in an opened contact trench/hole that is formed by a combination of litho/etching process has more conformal-like deposition along sidewalls of the contact trench/hole but much greater fill at the bottom of the contact trench/hole. After bottom-filling of the dielectric, the conformal deposition along the sidewalls of the contact trench/hole can be removed isotropically by an etch process. In yet another example, the dielectric cap material can be completely filled in the contact trench/hole and then either an isotropic or anisotropic etch process can be applied to recess the cap down to a desired thickness.

In some embodiments, the dielectric caps which have been deposited over the S/D contacts can also function as a quantitative dielectric separation among the overlying S/D metal contacts. Such a process includes using a bottom dielectric cap to server as an etch-stop point during forming a trench patterning of the upper S/D contact, thus a quantifiable margin of separation can be assured between staggered contacts.

Figure 3:
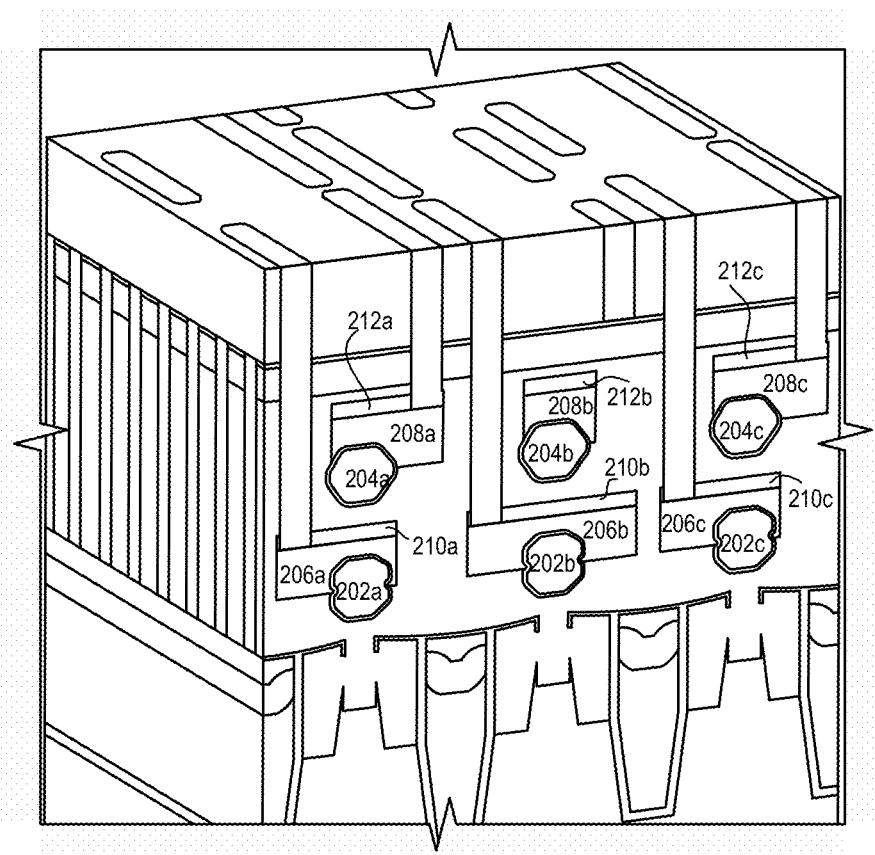
FIG. 3 is a cross-sectional view of a related 3D CFET device, in accordance with some embodiments.

FIG. 3 is a cross-sectional view of a related 3D CFET device 200. Comparing to the 3D CFET device 100, the dielectric caps 210 and 212 formed in the CFET device 200 only cover top portions of the source/drain contacts 206 and 208.

As mentioned above, a primary benefit of the CFET device 200 is the area scaling potential. In FINFET devices, two active areas are forced to exist in separate locations within the FINFET device. In the CFET device 200, however, through the complementary stacking, two active areas (i.e., bottom S/D 202, and top S/D 204), can be stacked over one another. A second benefit is that because the channel regions of the CFET device 200 are defined by nanowires, nanosheets, or nanorings, a chip-over-chip scaling is feasible. Accordingly the chip-over-chip scaling provides significantly increased scaling paths. A third benefit is that the S/D contacts (i.e., 206 and 208) can be staggered so that the S/D contacts can connect to multiple routing tracks in the BEOL, which thereby enables devices to go down from incorporating up to 6 routing tracks that is used for conventional foundry N7 types of devices, to as few as 3 or 4 routing tracks.

One of the challenges associated with the track-height based area scaling is the space congestion within the source and drain regions of the CFET device 200. Similar to device 100, the S/D regions are positioned between the low-k gate spacers. Even for a simple CFET device in which only a single NMOS and PMOS region are vertically stacked over one another, a number of connections can still be required to connect Vdd/Vss power rails to NMOS S/D contacts and PMOS S/D contacts, respectively, as well as connect the NMOS and PMOS S/D contacts to the interconnect metal layers in BEOL. The path of the connections as well as the size of the S/D contacts are critical and required to be scaled down so that the path and the size imposes no unwanted parasitic capacitance. In addition, the path and the size are required to be small enough not to cause excessive resistance in the device, and are separated from each other at a minimal distance in order to achieve the cell height advantages offered by the CFET device herein.

Figure 4A:
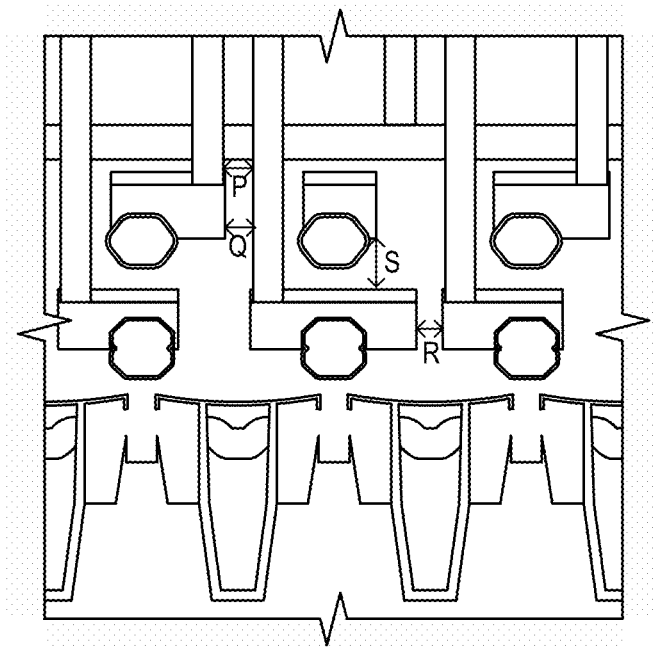
FIG. 4A is an expanded cross-sectional view of the related 3D CFET device, in accordance with some embodiments.
Figure 4B:
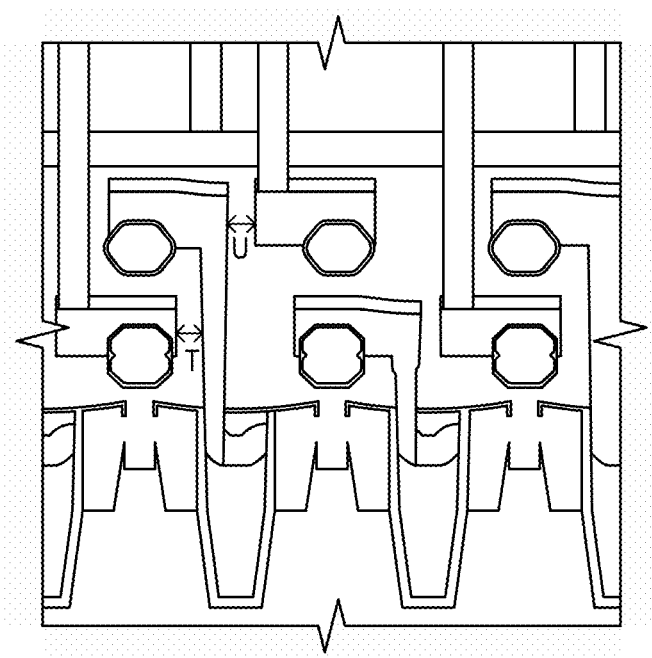
FIG. 4B is another expanded cross-sectional view of the related 3D CFET device, in accordance with some embodiments.

FIGS. 4A-4B is an expanded cross-sectional view of the CFET device 200 in the S/D region. FIGS. 4A and 4B provide two cross-sections obtained from two different S/D regions. The cross-sections include three side-by-side CFET standard cells of the CFET device 200. Each of the labels in FIGS. 4A and 4B corresponds to a different placement separation between two components in the CFET device 200. For example, as shown in FIG. 4A, P is a separation between a via-to-drain structure and an adjacent standard cell, such as an adjacent via-to-drain structure. Q is a separation between an upper tiered S/D contact (i.e., a PMOS S/D contact) and a via-to-drain structure connecting down to the lower-tiered S/D contact (i.e., a NMOS S/D contact) in an adjacent standard cell. R is a separation of two lower tiered S/D contacts in two adjacent standard cells. S is a placement between an upper and lower tier S/D contact. In FIG. 4B, T can be a separation between a lower tier S/D contact and an internal "tap" via, such as a via-to-rail structure that connects the upper S/D contact and a targeted power supply rail. The separation of T can be formed within a same standard cell or between two adjacent standard cells. U is a separation between two upper-tier S/D contacts between two adjacent standard cells.

Still referring to FIGS. 4A-4B, a misplacement between any two of the components can cause unintentional connections in the CFET device 200. Therefore, a solution that provides a self-alignment between a via-to-drain structure and a S/D contact, or between a via-to-rail structure and a power rail is required. The self-alignment can prevent the via-to-drain structure or the via-to-rail structure from connecting an untargeted component.

Figure 5A:
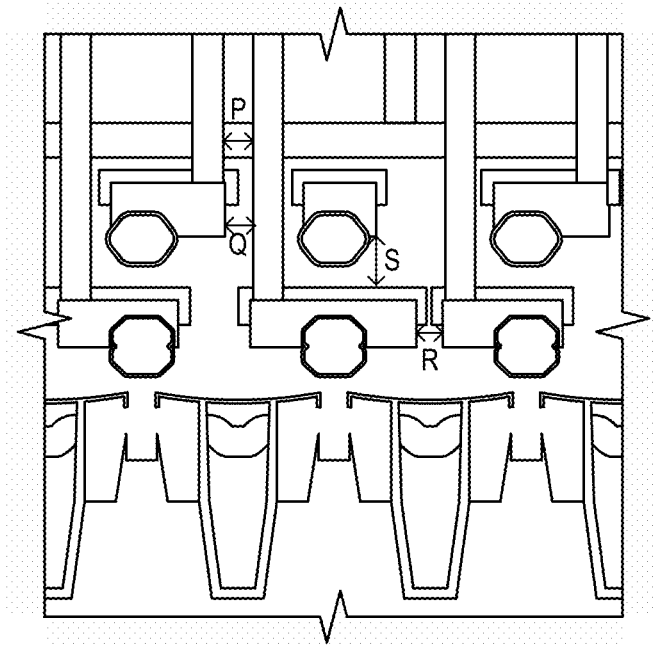
FIG. 5A is an expanded cross-sectional view of the 3D CFET device, in accordance with some embodiments.
Figure 5B:
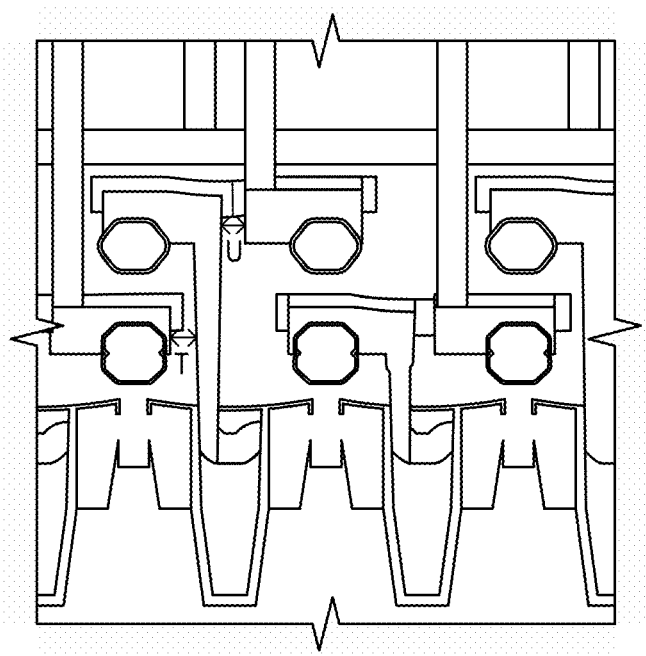
FIG. 5B is another expanded cross-sectional view of the 3D CFET device, in accordance with some embodiments.

FIGS. 5A-5B are expanded cross-sectional views of device 100 in the S/D region. FIGS. 5A-5B show similar cross-sections as FIGS. 4A-4B, but instead of placing an etch-selective dielectric cap only over the top plane surface of the S/D contacts, the pre-metal dielectric (PMD) layer (i.e., 132 in FIG. 2A) is slightly recessed after the tiered S/D contacts are metalized to expose lateral faces of the S/D contacts. A selective deposition process can then be used to form a dielectric cap along both the top and side-walls of the S/D contacts. Structures of FIGS. 5A-5B provide self-alignment capabilities for the CFET device 100 or other 3D devices.

FIGS. 5A-5B illustrates a self-alignment strategy that can prevent the via-to-drain structure or the via-to-rail structure from connecting an untargeted component. Firstly, the dielectric caps formed over the S/D contacts can include differing film composition and etch selectivity from the adjacent dielectric films, such as the PMD. The different film composition and etch selectivity can help open up either an upper (top) or a lower (bottom) S/D contact during the nanofabrication of the device 100. Secondly, another self-alignment capability can be achieved by introducing dielectric caps that covers side portions of the S/D contacts. As mentioned above, the dielectric caps that cover the side portions of the S/D contacts can be implemented through doing a recess of the pre-metal dielectric (PMD) layer in the S/D region after the S/D metal contact metallization. The recess of the PMD layer in the S/D region can expose side portions of the S/D contact that can have a bar shape. Subsequently, the dielectric caps can be selectively deposited along the side portions of the S/D contacts. As shown in FIGS. 5A-5B, the dielectric caps formed along the side portions of the S/D contacts can effectively form a "channel" in which a via-to-drain structure or an internal via-to-rail structure can be formed in PMD layer without causing any unwanted connection to any uncontacted S/D contact, In addition, the formed channel provides a fixed distance to prevent the via-to-drain structure or the via-to-rail structure from connecting any adjacent S/D contact, which in turn provides a margin for parasitic control within the device 100.

Figure 6A:
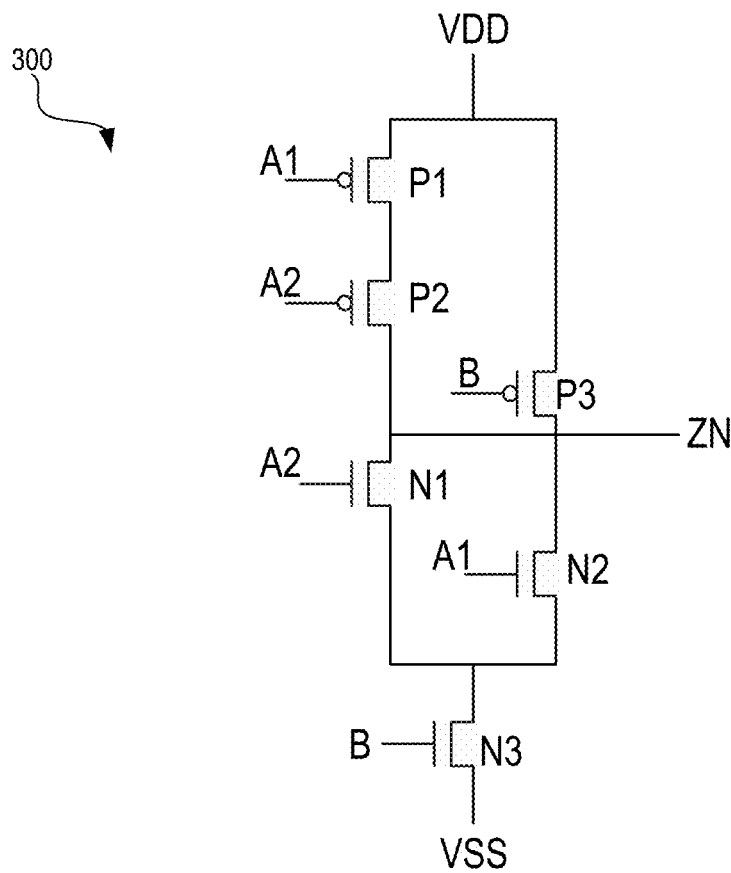
FIG. 6A is a schematic circuit diagram of the 3D CFET device, in accordance with some embodiments.
Figure 6B:
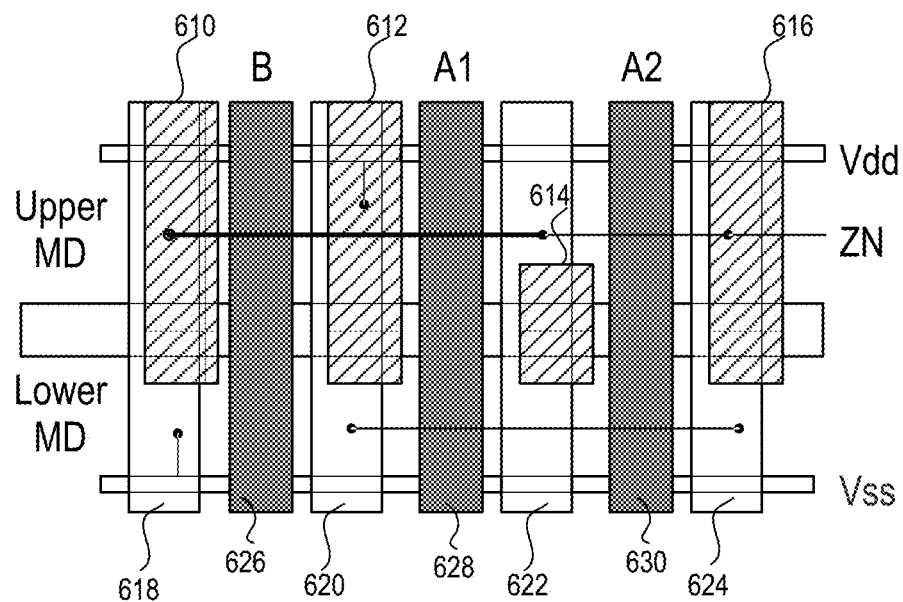
FIG. 6B is a schematic layout diagram of the 3D CFET device, in accordance with some embodiments.

FIG. 6A can be a schematic circuit diagram of the device 100, and FIG. 6B can be a correspondingly schematic layout diagram of the device 100. FIG. 6A discloses an And-Or-Inverter (AOI) circuit 300. The circuit 300 can include three PMOS transistors P1-P3, and three NMOS transistors N1-N3. As shown in FIG. 6A, a source region of P1 and a source region of P2 are connected to a common Vdd voltage, and a source region of N3 is connected to a Vss voltage. During operation, a first input voltage A1 is applied to P1 and N2, a second input voltage A1 is applied to P2 and N1. A third gate voltage B is applied to P3 and N3. ZN in the circuit 300 can be an output voltage. FIG. 6B is a corresponding layout diagram of circuit 300, where 610-616 corresponds to the PMOS S/D contacts, 618-624 corresponds to the NMOS S/D contacts, and 626-630 correspond to gate structure where three input signals are applied. The Vss and Vdd power rails can be buried in the bulk silicon so the device 100 can function as a 3-track cell height. It should be noted that FIGS. 6A and 6B are merely exemplary circuit structures of device 100. The device 100 can include other suitable circuit structures based on application requirements.

FIG. 7 through FIG. 18 are cross-sectional views of various intermediary steps of manufacturing the 3D CFET device 100. For simplicity, the device 100 can be shown as a 4-track cell height and all critical separations between S/D contacts, the via-to-drain structures and the via-to-rail structures are based on the 4-track cell height. In addition, the bottom channel region can include three side-by-side nanosheets or nanowires. And the top channel region can also include three side-by-side nanosheets or nanowires. However, the bottom and top channel regions can include any number of nanosheets or nanowires based on the circuit design.

It should be noted that the FIG. 7 through FIG. 18 merely describes an exemplary process flow of manufacturing the CFET device 100. The exemplary flow includes a method of manufacturing the device 100 incorporating the self-alignment capability of connecting the BEOL routing tracks and the tiered S/D contacts through the via-to-drain structure. In the disclosed process flow, the dielectric-on-metal selective deposition process can enable self-alignment for virtually any three-dimensional device by providing a laterally-facing and top-facing spacer (or cap) which can be used to encapsulate any specific feature. Not that there are many variations and other 3D devices covered and enabled by techniques herein.

Figure 7A:
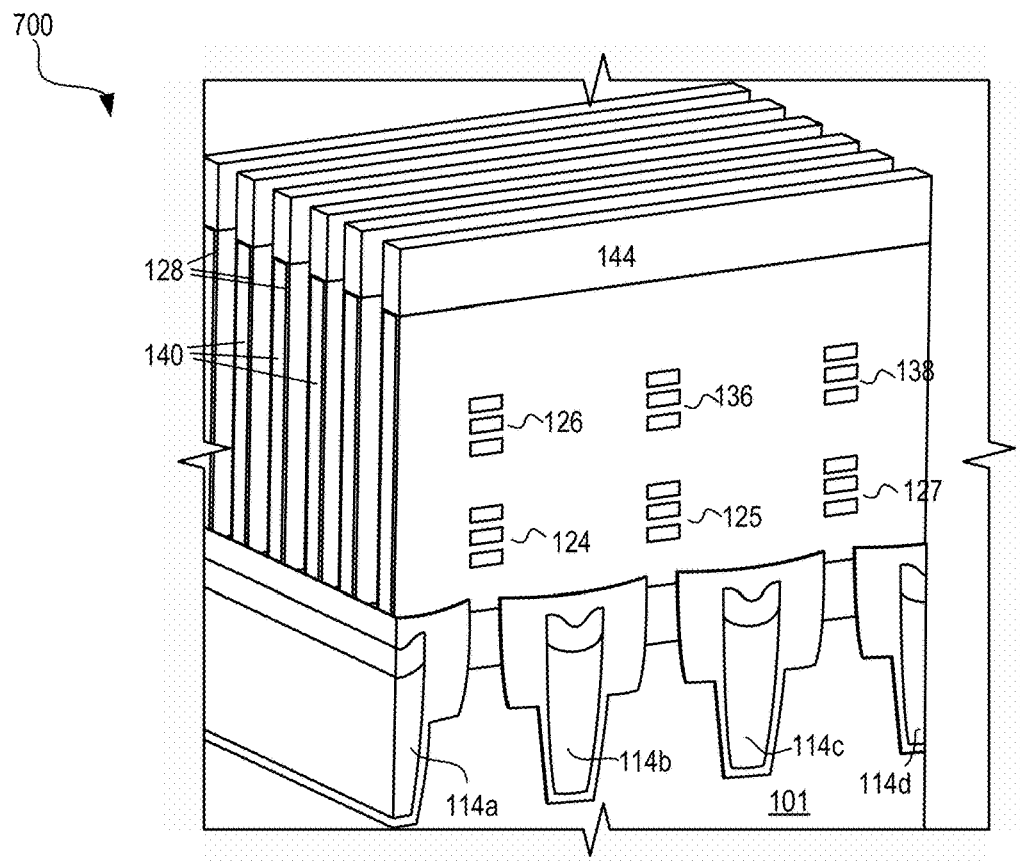
FIGS. 7A-18C are cross-sectional views of various intermediary steps of manufacturing the 3D CFET device, in accordance with some embodiments.

As shown in FIG. 7A, a semiconductor structure 700 can be formed. The semiconductor structure 700 can include a plurality of bottom channel regions 124, 125 and 127. Each of the bottom channel structures can further include three nanosheets. The semiconductor structure 700 also includes a plurality of top channel regions 126, 136, and 138 that are formed over the bottom channel structures, and each of the top channel structures includes three nanosheets. In an embodiment of FIG. 7A, the bottom channel structures can be NMOS channel structures and the top channel structures are PMOS channel structures. Both of the NMOS channel structures and the PMOS channel structures can be made of Si, SiGe, or Ge. The semiconductor structure 700 includes a plurality of replacement gates 140. A plurality of low-k gate spacers 128 are formed along sidewalls of the replacement gates 140. The replacement gates can be replaced by high-k/metal gates in future steps.

Still referring to FIG. 7A, the NMOS and PMOS channel structures can protrude through the low-k gate spacers 128 and the replacement gates 140. The semiconductor structure 700 further includes a plurality of power rails 114a-114d that are buried in the substrate 101. The plurality of power rails can be positioned below the NMOS channel structures to form a stair-case configuration between the NMOS channel structures and the power rails. The power rails can be electrically coupled with a Vdd or Vss input voltage. The NMOS and PMOS channel structures extend along a length direction of the power rails. The semiconductor structure 700 can also include a plurality of nitride caps 144 over the replacement gates. Each of the plurality of nitride caps 144 can be disposed on a respective replacement gate 140.

Figure 7B:
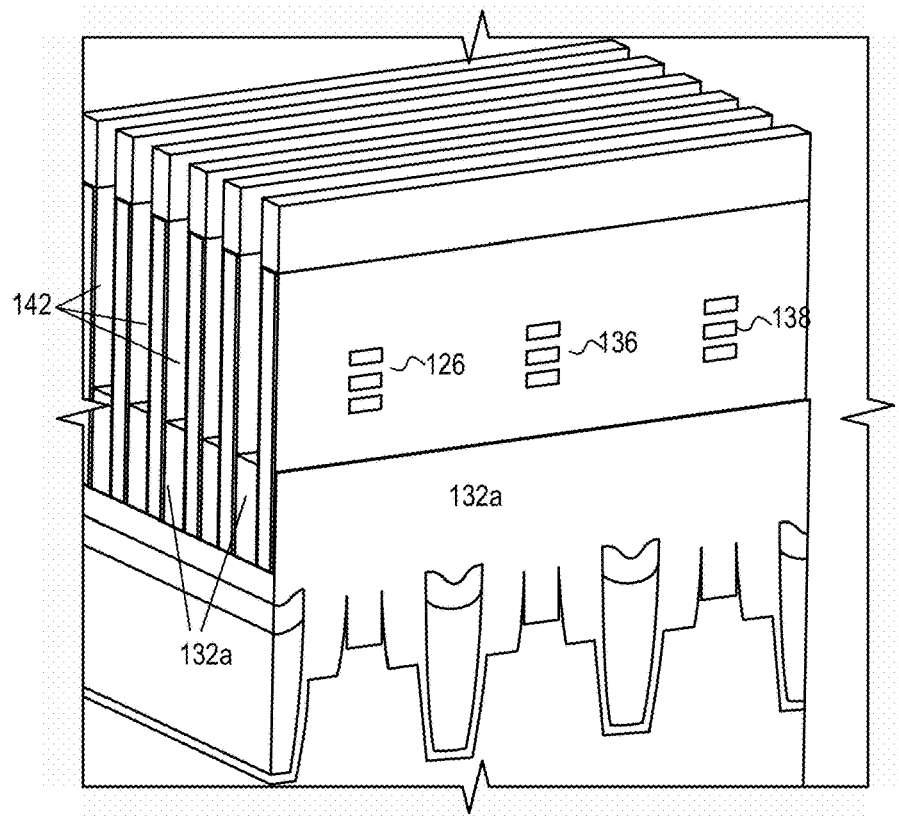

In FIG. 7B, a first PMD layer 132a can be bottom-filled into gaps 142 that are formed between the low-k spacers in the semiconductor structure 700 to cover the bottom NMOS channel structures and expose the top PMOS channel structures. In an example, the first PMD layer 132a layer can be made of SiO, TEOS oxide, SiH4 oxide, BPSG, PSG, USG, SOD, or the like. In another example, the first PMD layer can optionally be deposited so as to fill the gaps 142 fully. A subsequent planarization process, such as a CMP process, can be applied to planarize the first PMD layer 132a down to the nitride caps 144, and then an etching process can be applied to recess the first PMD layer 132a to a targeted height so that the bottom NMOS channel structures are covered by the first PMD and the top PMOS channel structures are exposed. In some embodiments, comparing to the deposition/CMP/etch-recess process, the bottom-fill process is preferred because the bottom-fill process can be implemented with a much more precision. The deposition/CMP/etch-recess process can introduce variability from three different steps.

Figure 7C:
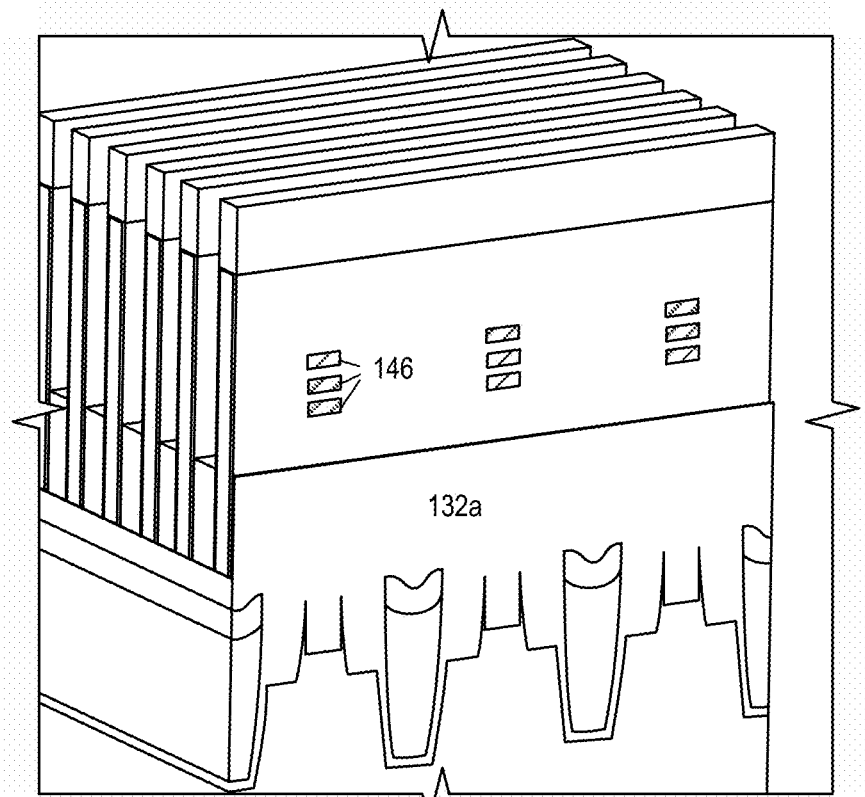

In FIG. 7C, once only the PMOS silicon nanosheets are exposed, the PMOS silicon nanosheets can be recessed by an etching process, such as a TEL CERTAS etch process (vapor phase etching) and then capped with an etch-selective nitride film 146. In another example, the PMOS silicon nanosheets can be covered with a nitride layer by using a conventional atomic layer deposition and then be recessed through a spacer-open etch in order to plug (cap) the PMOS channel.

Figure 8A:
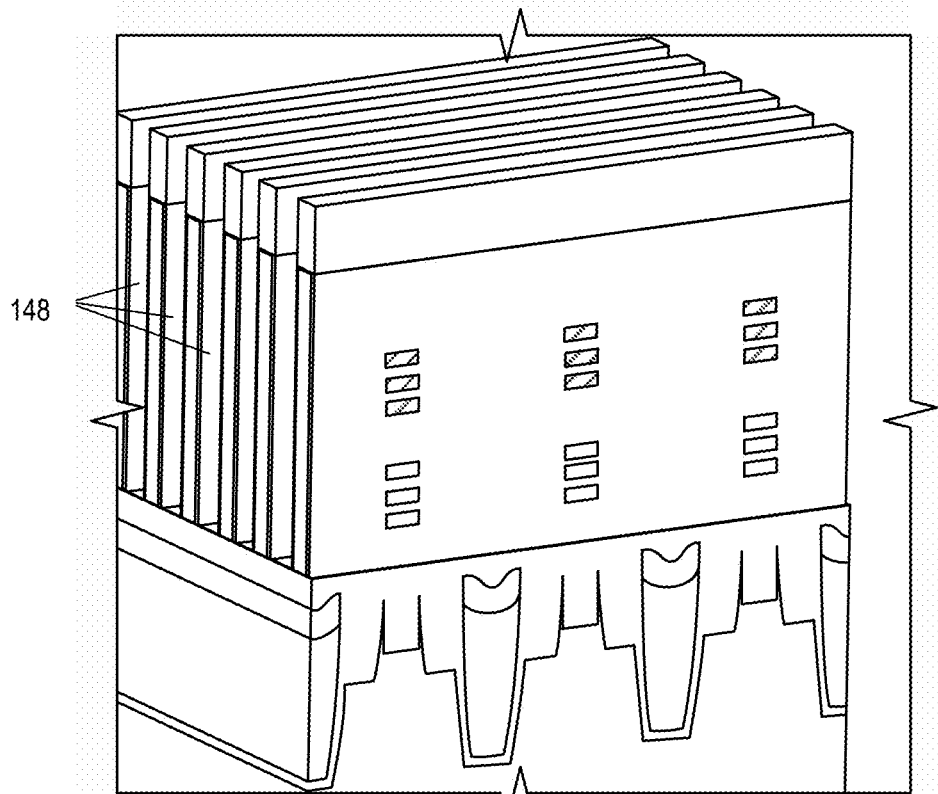
Figure 8B:
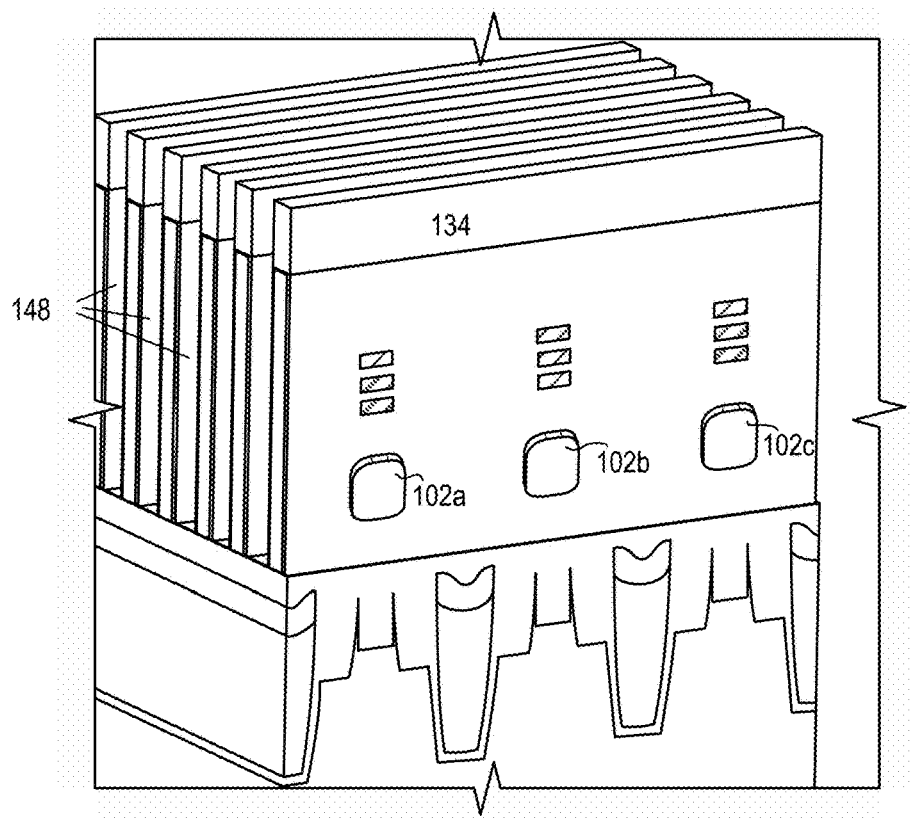
Figure 8C:
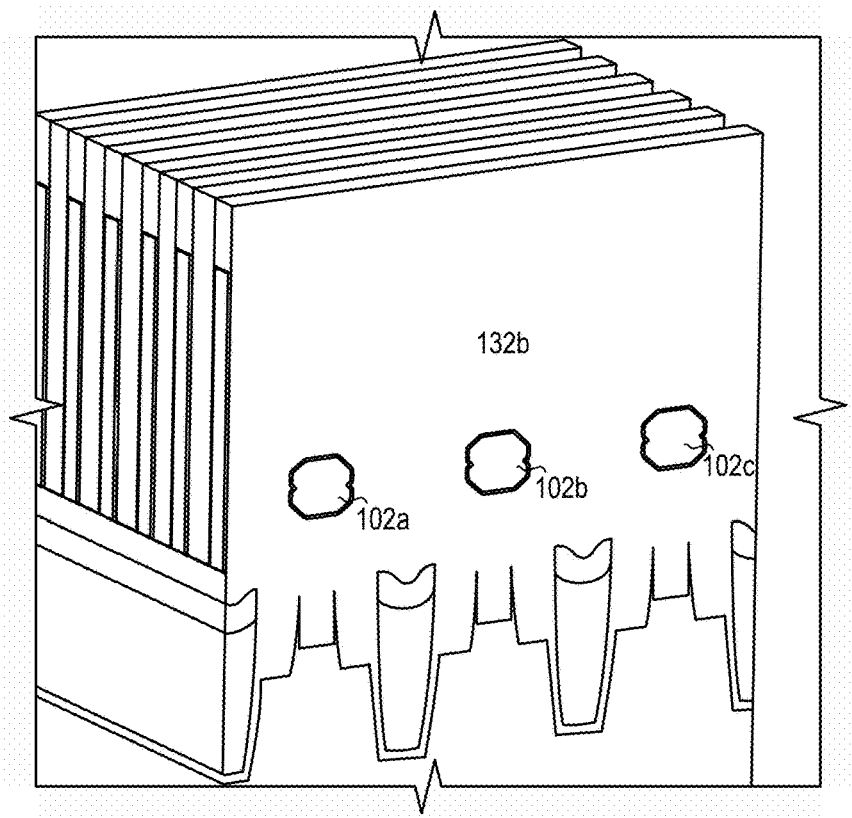

In FIG. 8A, the first PMD layer 132a can then be removed to expose the lower (bottom) tier NMOS nanostructures (i.e., nanosheets, nanowires). Accordingly, a plurality of gaps 148 can be formed in the semiconductor structure 700. In FIG. 8B, once the bottom nanosheets are exposed, a plurality of bottom sources/drains 102a-102c can be formed through an epitaxial growth process. The bottom NMOS sources/drains 102a-102c can be made of silicon doped with phosphorous. The bottom NMOS sources and drains can surround the bottom channel structures, and disposed between the low-k spacers. In some embodiments, a subsequent atomic layer deposition of a Ti layer can be executed to form a TiSi layer on the surfaces of the sources and drains. The Ti layer remains on rest areas of the semiconductor structure 700 can be removed after the formation of the TiSi layer on the surfaces of the sources and drains through a selectively etching process. In FIG. 8C, a second PMD layer 132b can be filled into the gaps 148, and planarized through a CMP process, where the nitride caps 144 can server as a stopping layer for the CMP process.

In FIGS. 9 and 10, the bottom S/D contacts and the via-to-rail structures can be formed. Several approaches can be applied to form bottom S/D contacts and the via-to-rail structures. In an example, a dual-damascene approach (structure) can be used in which the bottom S/D contacts can be formed similar to a formation of the initial metal layers (i.e., 122 in FIG. 2A) in the BEOL. The dual damascene structure can include a bar-shaped contact and an via. The via can function as the via-to-rail structure to provide connection between the buried power rails and the bottom S/D contacts. In the dual-damascene approach, a dual-damascene openings that includes a S/D contact opening and a via opening can be formed by transferring patterns from a hard mask stack into the PMD layer through an etching process. The dual-damascene openings can be formed through multiple optional techniques, such as an EUV direct print, an EUV LELE (litho/etch/litho/etch), a spacer-assisted LELE, and a multiple patterning (i.e., SADP/SAQP (Self-aligned double/quad patterning)) by using conventional or self-aligned blocking methods.

Figure 9A:
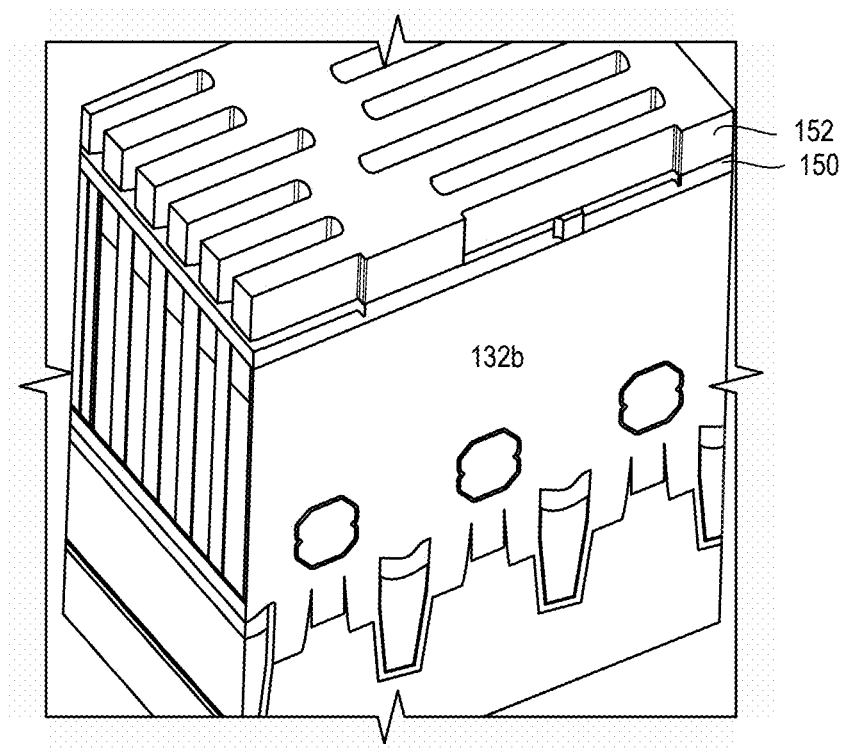
Figure 9B:
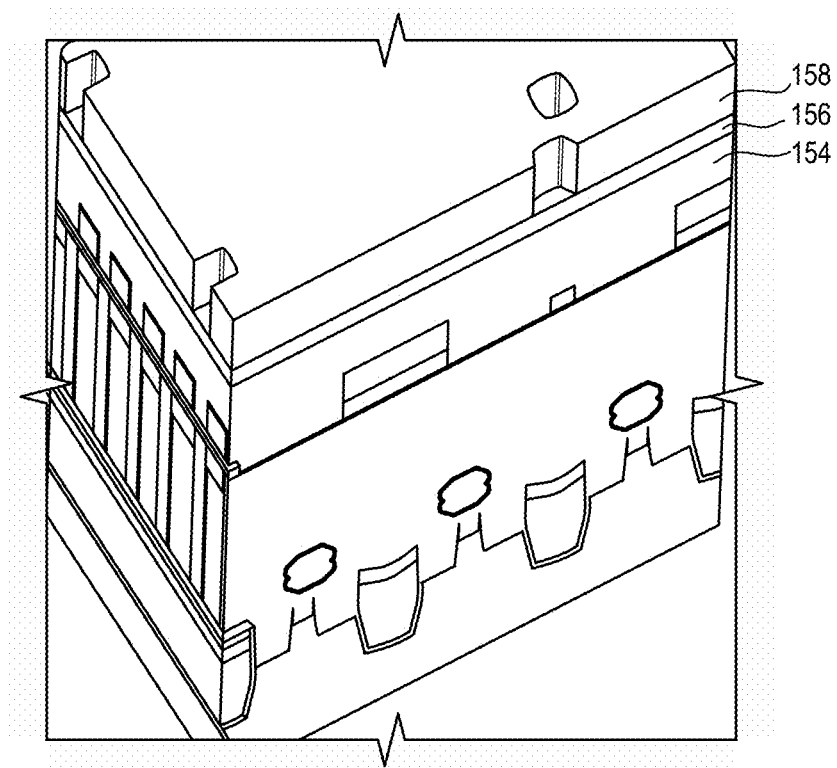
Figure 9C:
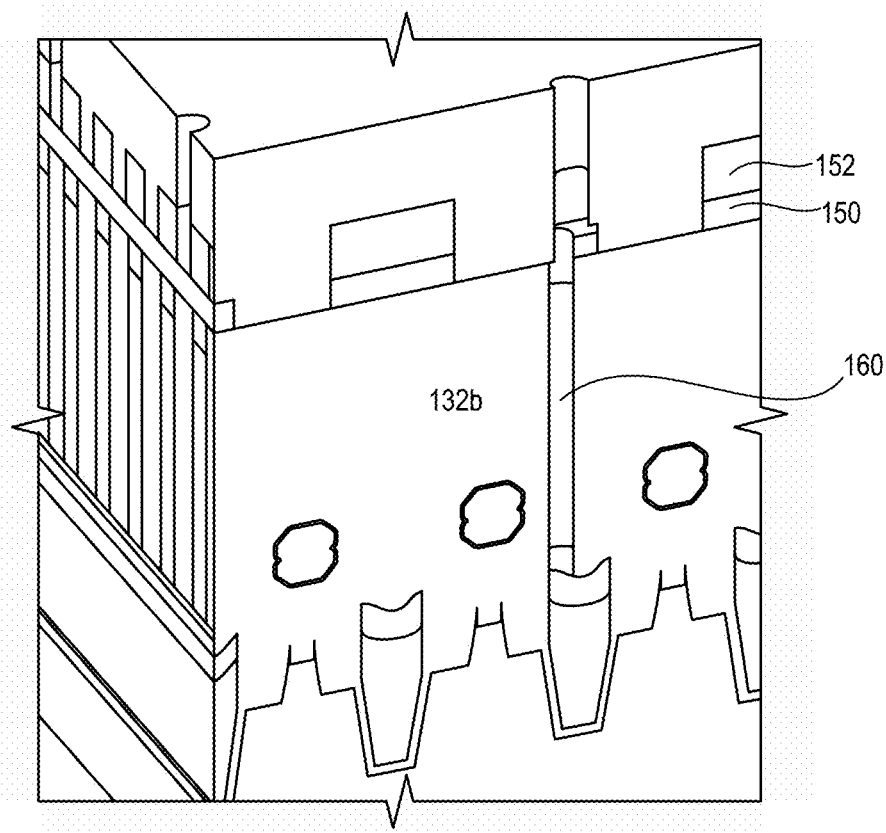

As shown in FIG. 9A, a first hard mask stack that includes a TiN/TiO hard mask layer 150, and a TEOS layer 152 can be formed and patterned. The patterns formed on the first hard mask stack can be used to form the S/D contact openings. In FIG. 9B, a second hard mask stack that includes a spin on carbon layer 154, a SiON layer 156, and a photoresist layer 158 can be formed and patterned over the first hard mask stack. The patterns formed on the second hard mask stack can be used to form the via-to-rail openings. In FIG. 9C, a first etching process, such as a dry etch process, can be applied to transfer the patterns of via-to-rail opening from the second hard mask to the second PMD layer 132*b*. After the first etching process, a plurality of via-to-rail openings 160, can be formed in the second PMD layer 132*b*. In an embodiment, the via-to-rail openings 160 can stop on the rail dielectric caps 120 of the power rails. In another embodiment, the via-to-rail openings 160 can pass through the rail dielectric caps 120 of the power rails so as to expose the power rails.

Figure 10A:
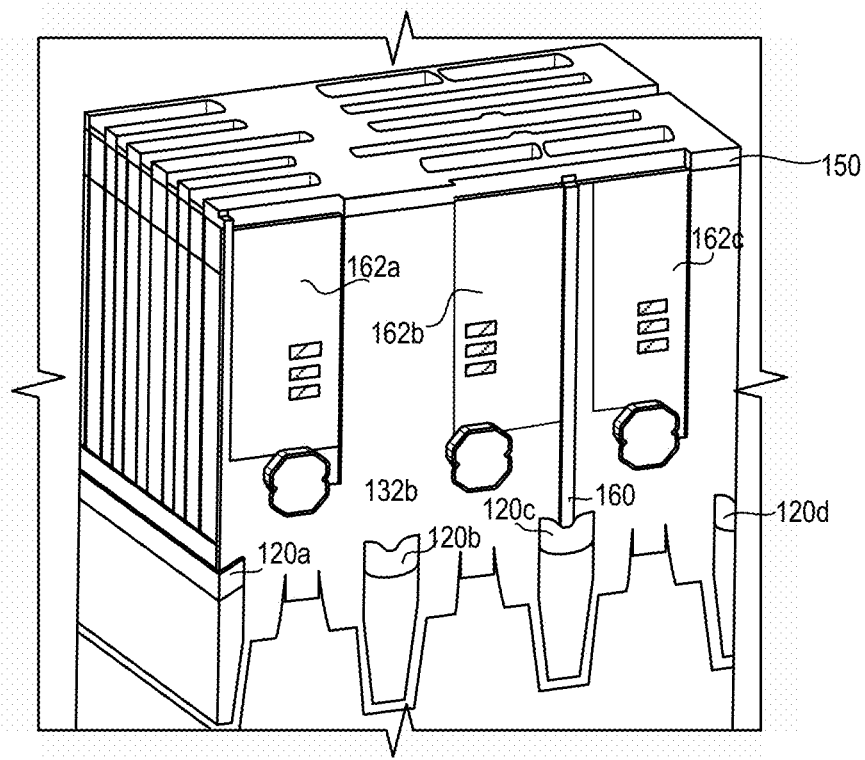

In FIG. 10A, a second etching process can be applied to transfer the patterns of the first hard mask stack to the PMD layer to form a plurality of S/D contact openings. When the second etching process is completed, the TEOS layer 152, the spin on carbon layer 154, the SiON layer 156, and the photoresist layer 158 can be consumed by the second etching process, and only the TiN/TiO hard mask layer 150 remains. As shown in the dual damascene approach, the patterns of the bottom S/D contact opening can be memorized in a given hard-mask (i.e., 150, 152), and the hard-mask is subsequently filled in with spin-on carbon materials (i.e., 154, 156, and 158). Patterns of via-to-rail openings can be formed in the spin-on carbon materials, and then be transferred to the PMD layer. The disclosed dual-damascene process provides an initial top-down self-alignment between the via-to-drain structure and the buried power rail. The self-alignment between the via-to-drain structure and the buried power rail can be achieved through a rail dielectric cap (i.e., 120) that is deposited directly over the surface of the buried power rail, where the etch selectivity of the rail dielectric cap is different compared to the oxide of the PMD layer.

Still referring to FIG. 10A, the second etching process can be a straight oxide etch followed by an atomic layer or quasi-atomic layer etch once the bottom NMOS sources and drains 102 are reached, in order to provide maximum selectivity between the oxide of second PMD layer 132*b* and the TiSi or any contact etch stop layer (CESL) liner deposited over the TiSi that is formed on the surface of the bottom NMOS sources and drains 102. It should be noted that the via-to-rail openings 160 can pass through the rail dielectric caps 120 of the power rails when the second etching process is completed.

Figure 10B:
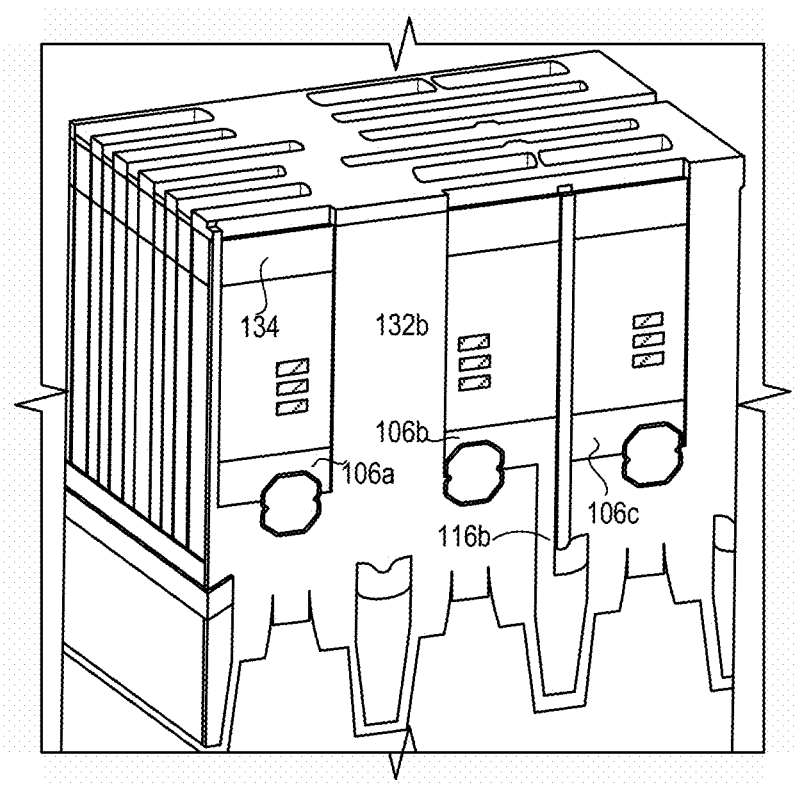

In FIG. 10B, the bottom S/D contact openings 162 and the via-to-rail openings 160 can be bottom-filled with a contact (conductive) material. The contact material can be tungsten, cobalt, copper, ruthenium, or the like. Selection of the contact material can be dependent upon one or more thermal processes that can be introduced in the subsequent process steps. Due to the subsequently introduced thermal processes, such as a S/D dopant activation and a high-k anneal, the selection of the contact material is generally limited to a metal, such as ruthenium. In some embodiments, a liner material can be deposited before the contact material is deposition. The liner material can be TaN, for example, in order to provide optimum filling capability.

Still referring to FIG. 10B, any excessive ruthenium that are deposited in the bottom S/D contact openings can be etched away to reach a desired thickness. When the etch away process is completed, the bottom NMOS S/D contacts 106 with a bar-shape and the via-to-rail structures, such as 116*b*, with a trench-shape can be formed. The via-to-rail structures can connect the bottom S/D contacts and targeted power rails. The bar-shaped bottom NMOS S/D contacts can have a top portion (surface), a bottom portion (surface), and two side portions (surfaces). In addition, the TaN liner formed over the top surface of the bottom NMOS S/D contacts can be removed by the etch away process. Accordingly, the top portion of the bottom S/D contact includes ruthenium without any liner material.

Figure 10C:
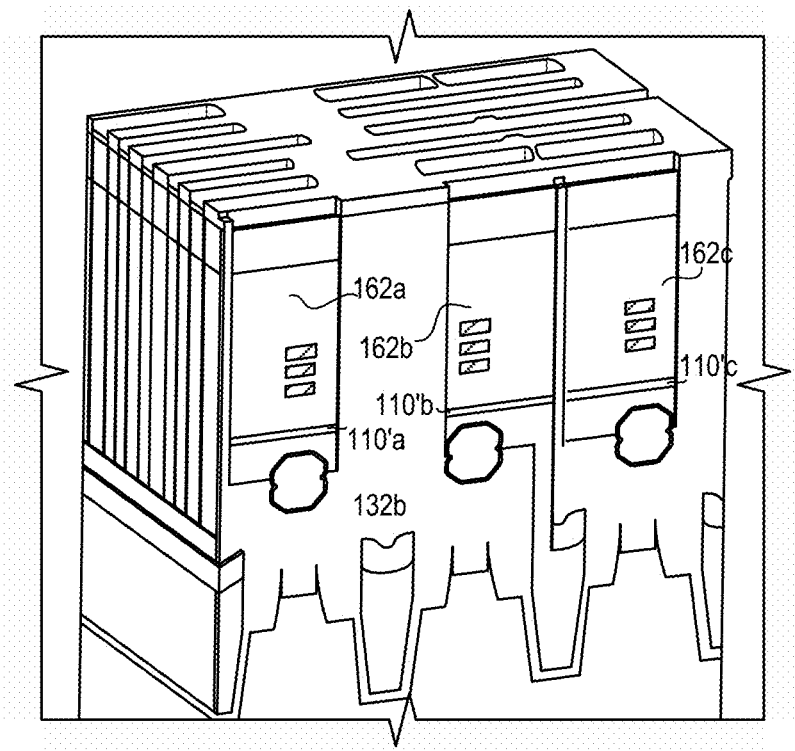

In FIG. 10C, over the top portion of the bottom NMOS S/D contacts, a first layer 110' of the bottom dielectric cap can be selectively deposited. The first layer 110' can be made of metal oxide materials, such as AlO. The first layer can also be made of SiO, SiC, SiN, SiOC, SICN, SiOCN, an organic-based material, or the like. The first layer can be metal film made of tungsten, ruthenium, cobalt, copper, liner materials containing metals (such as TaN, TiN, Ta, and Ti). In an embodiment of FIG. 10C, the first layer 110' is AlO and can be formed through an atomic layer deposition (ALD) process, a chemical vapor deposition (CVD) process, a diffusion process, or other suitable deposition processes. In another embodiment, the first layer 110' can be deposited through other means, such as filling/CMP/etch-recess, or a bottom-filling directly into the trench.

Figure 11A:
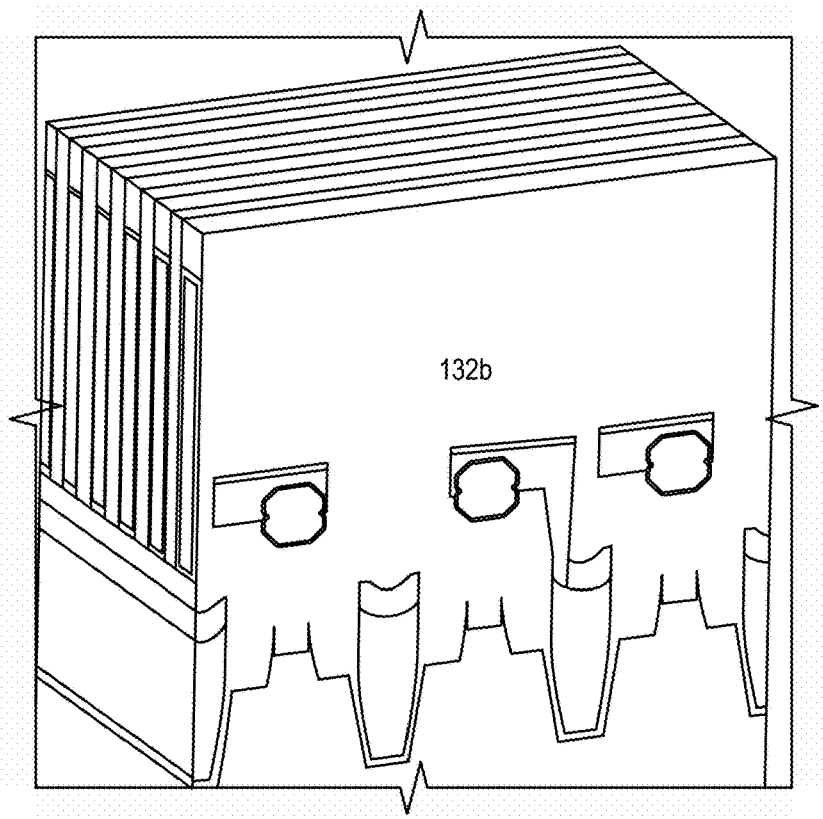
Figure 11B:
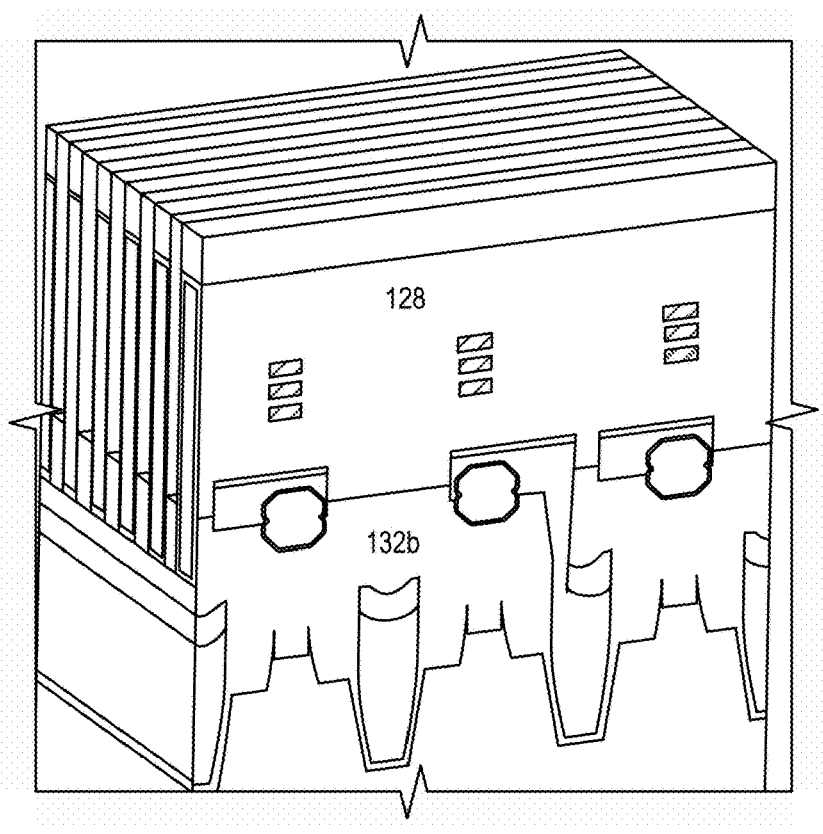
Figure 11C:
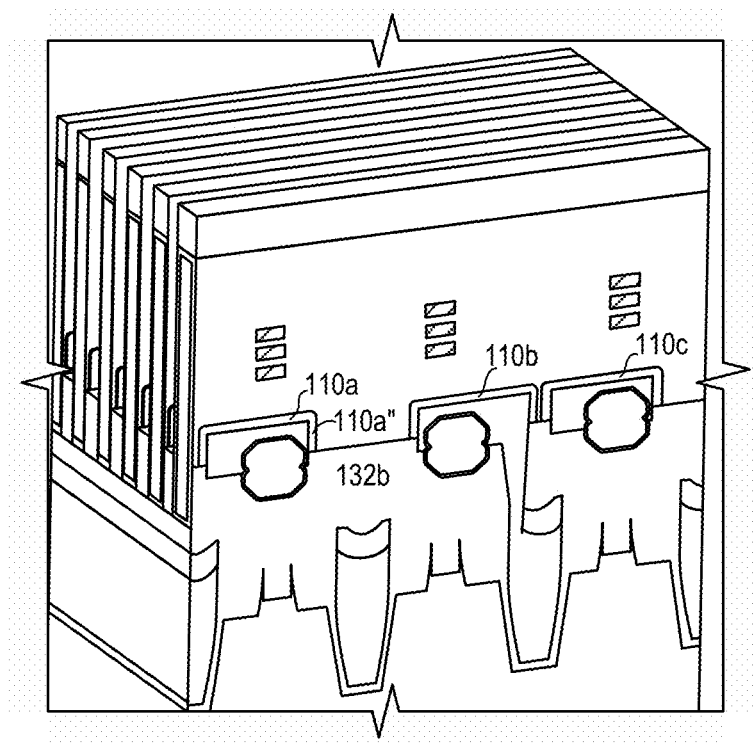

In FIG. 11A, the bottom S/D contact openings 162 can then be filled with oxide, such as SiO to form a complete second PMD layer 132*b*. The second PMD layer 132*b* can be subsequently planarized through a CMP process down to the nitride caps 144. In FIG. 11B, the second PMD layer 132*b* can be recessed again so that the side portions of the bottom S/D contacts can be exposed through an third etching process by using the first layer 110' as a stopping layer. In an embodiment, the third etching process recesses the second PMD layer 132*b* and exposes the TaN liner that formed on the side portions of the bottom S/D contacts. In another embodiment, the third etching process can further remove the liner material, such as the TiN, from the side portions of the bottom S/D contacts and expose the contact material, such as ruthenium. In FIG. 11C, a second layer 110" of the bottom dielectric cap can be formed over the first layer 110'. The second layer 110" can further cover the side portions of the bottom S/D contacts. The second layer can include SiO, SiC, SiN, SiOC, SICN, SiOCN, an organic-based material, or the like. As shown in FIG. 11C, when the second layer 110" is deposited, the bottom dielectric caps 110 are formed.

FIGS. 12-13 provide a dual damascene approach to form dual damascene openings that include top S/D contact openings and via-to-rail openings. The top S/D contact openings and via-to-rail openings can be formed by transferring patterns of the hard mask stack into the PMD layers. Formation and transferring of the patterns in the hard mask stack can be implemented through various methods, such as (a) direct EUV exposure, (b) EUV LELE, (c) spacer-assisted LELE, (d) multiple patterning such as SADP/SAQP incorporating direct block/cut layers or an integrated self-aligned block process.

Figure 12A:
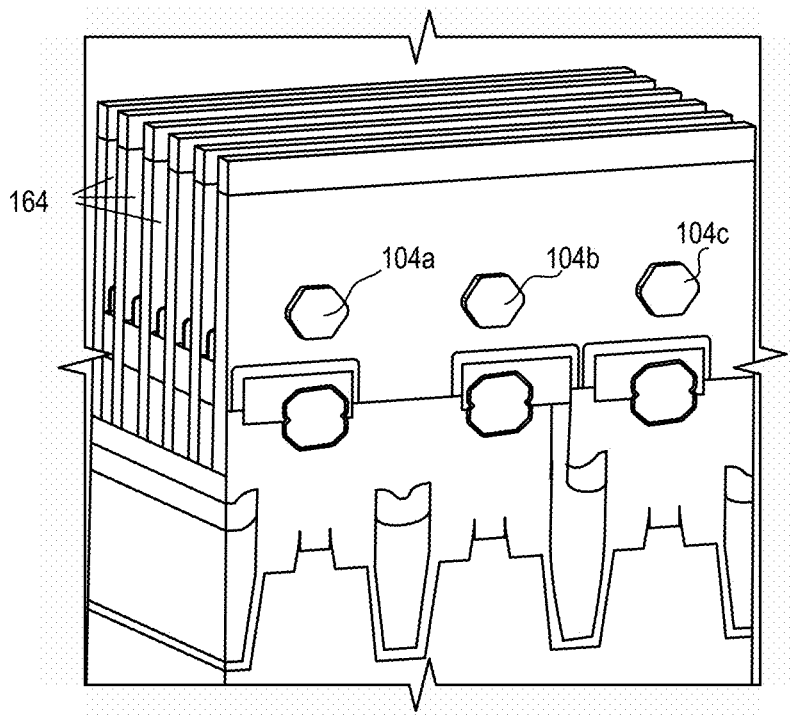

As shown in FIG. 12A, the etch-selective nitride film 146 that covers the top PMOS channel region which includes three nanosheets can then be removed. Subsequently, the SiGe:B top sources and drains 104 can be epitaxially grown from the silicon based nanosheets. Further, atomic layer deposition of Ti can be applied on the grown PMOS sources and drains in order to selectively form TiSi. The Ti layer remains on the rest areas of the semiconductor structure 700 can be removed after the formation of the TiSi.

Figure 12B:
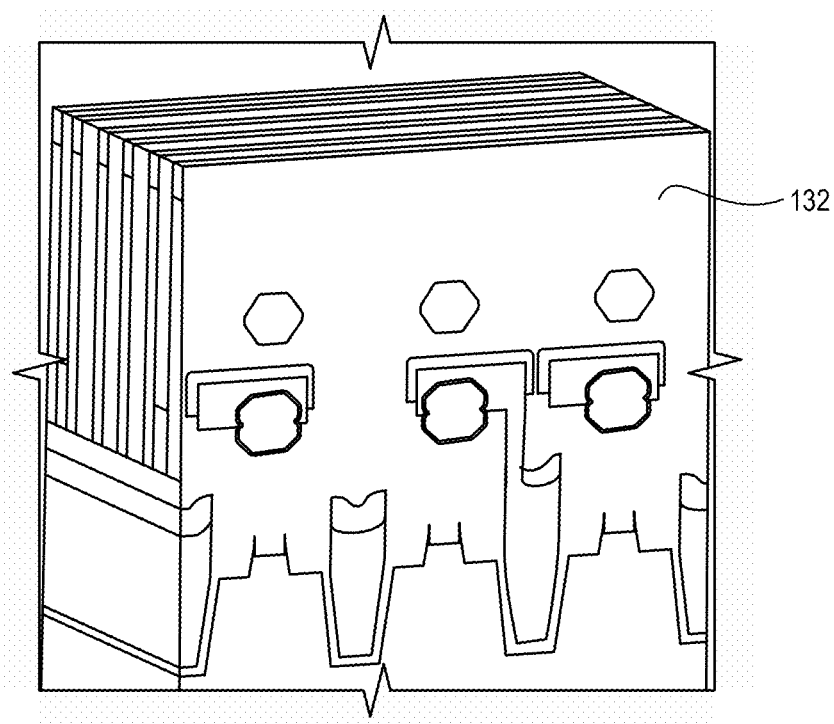
Figure 12C:
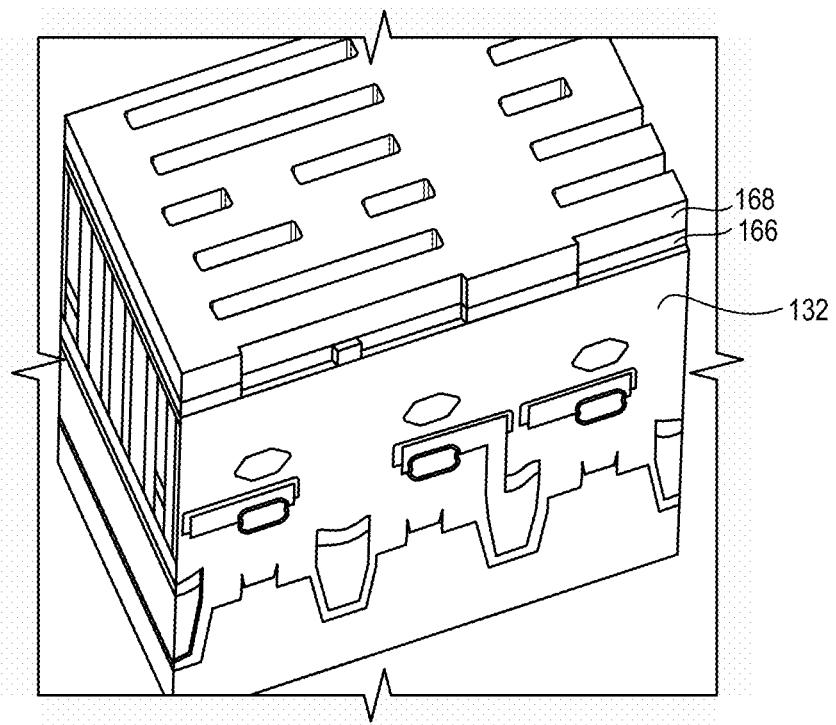
Figure 13A:
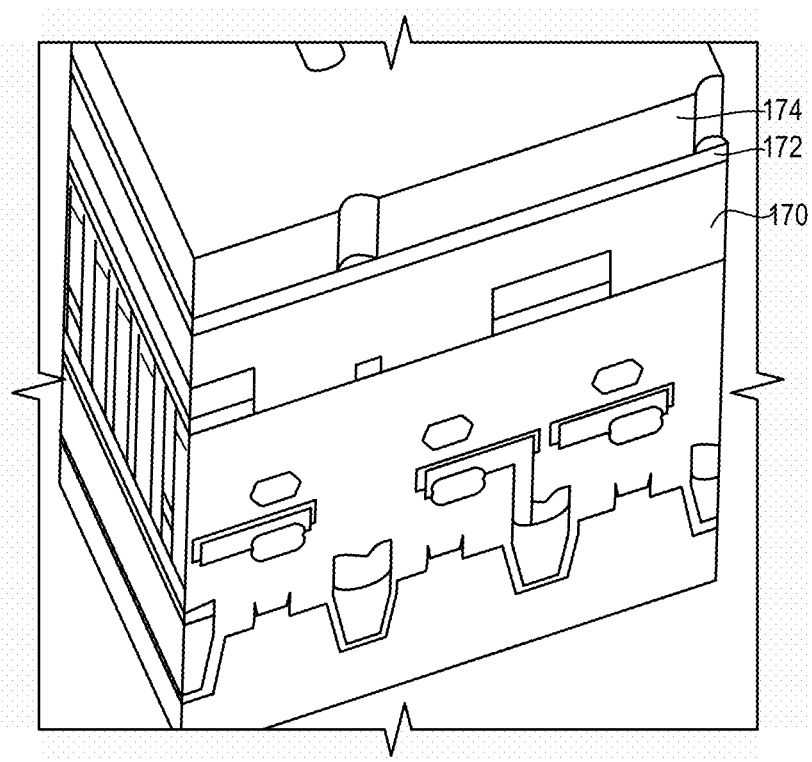
Figure 13B:
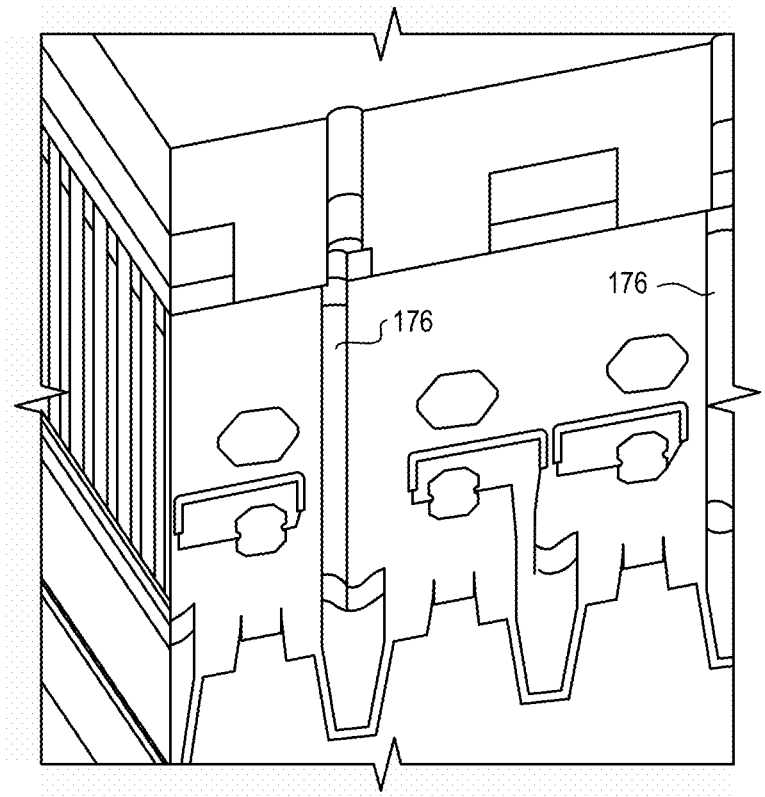

In FIG. 12B, gaps 164 that are formed by the third etching process can be filled with oxide to form the PMD layer 132. In FIG. 12C, a third hard mask stack that includes a TiN/TiO hard mask layer 166, and a TEOS layer 168 can be formed and patterned. The patterns formed on the third hard mask stack can be used to form the top S/D contact openings. In FIG. 13A, a fourth hard mask stack that includes a spin on carbon layer 170, a SiON layer 172, and a photoresist layer 174 can be formed and patterned over the third hard mask stack. The patterns formed on the fourth hard mask stack can be used to form the via-to-rail openings. In FIG. 13B, a fourth etching process, such as a dry etch process, can be applied to transfer the patterns of via-to-rail opening from the fourth hard mask to the PMD layer 132. After the fourth etching process, a plurality of via-to-rail openings 176, can be formed in the PMD layer. In an embodiment, the via-to-rail openings 176 can stop on the rail dielectric caps 120 of the power rails. In another embodiment, the via-to-rail openings 176 can pass through the rail dielectric caps 120 of the power rails to expose the power rails.

Figure 13C:
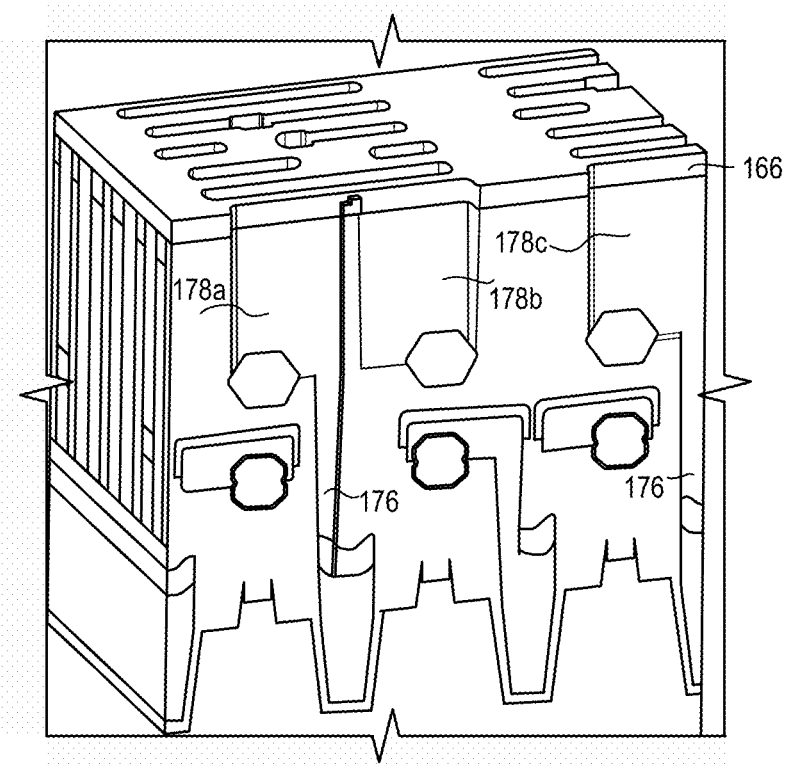

In FIG. 13C, a fifth etching process can be applied to transfer the patterns from the third hard mask stack to the PMD layer 132 so as to form a plurality of top S/D contact openings 178. When the fifth etching process is completed, the TEOS layer 168, the spin on carbon layer 170, the SiON layer 172, and the photoresist layer 174 can be consumed by the fifth etching process, and only the TiN/TiO hard mask layer 166 remains.

Figure 14A:
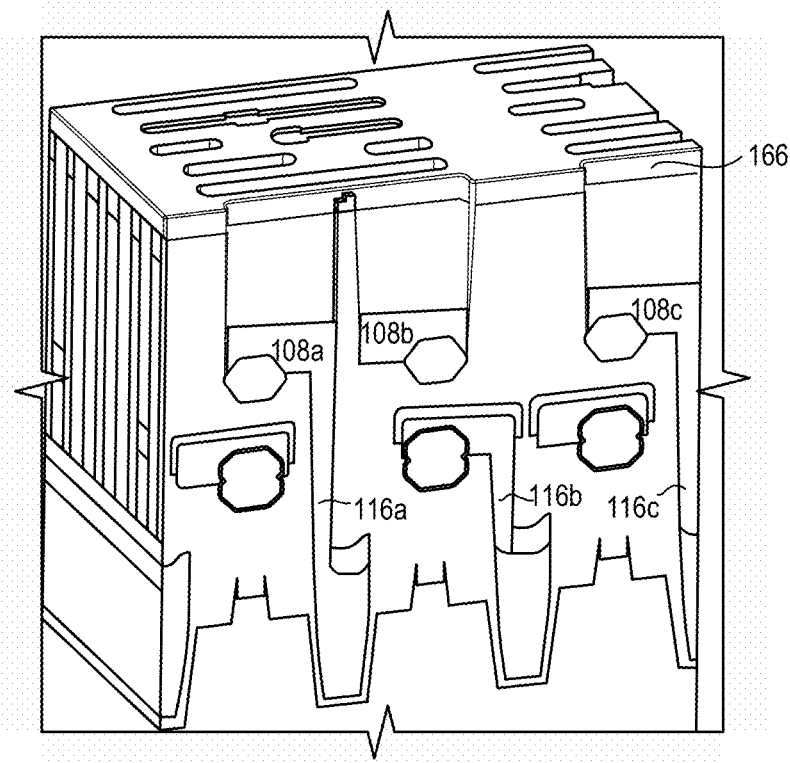

As shown in FIG. 14A, once the top S/D contact openings 178 and the via-to-rail openings 176 are formed in the PMD layer 132, a metal layer can be deposited into the top S/D contact openings 178 and the via-to-rail openings 176. In an embodiment, a bottom-up filling process can be applied in order to better control a final height of the top S/D contacts and ensure a complete filling of the via-to-rail openings 176. Using a bottom-fill process can be beneficial to control variability of the final height of the S/D contact as well as to reduce the total number of steps/cost/cycle time to make the process more economically beneficial. In an embodiment, a liner, such as TaN can be formed before the metal layer is deposited. An subsequent isotropic etching can be applied to remove any excessive metal layer formed along sidewalls of the top S/D contact openings. When the isotropic etching is completed, the top PMOS S/D contacts 108 and the via-to-rail structures 116a and 116c can be formed. The via-to-rail structures can connect the top S/D contacts to targeted power rails. The top PMOS S/D contacts 108 can have a bar-shape with a top portion, a bottom portion, and side portions. The isotropic etching can also remove any liner formed over the top portions of the top PMOS S/D contacts.

Figure 14B:
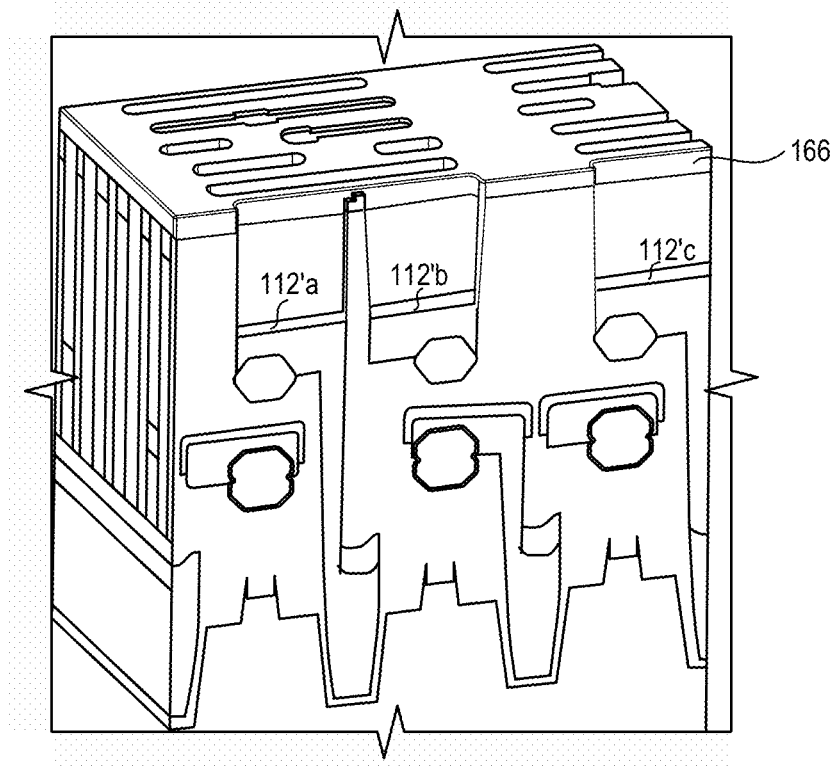
Figure 14C:
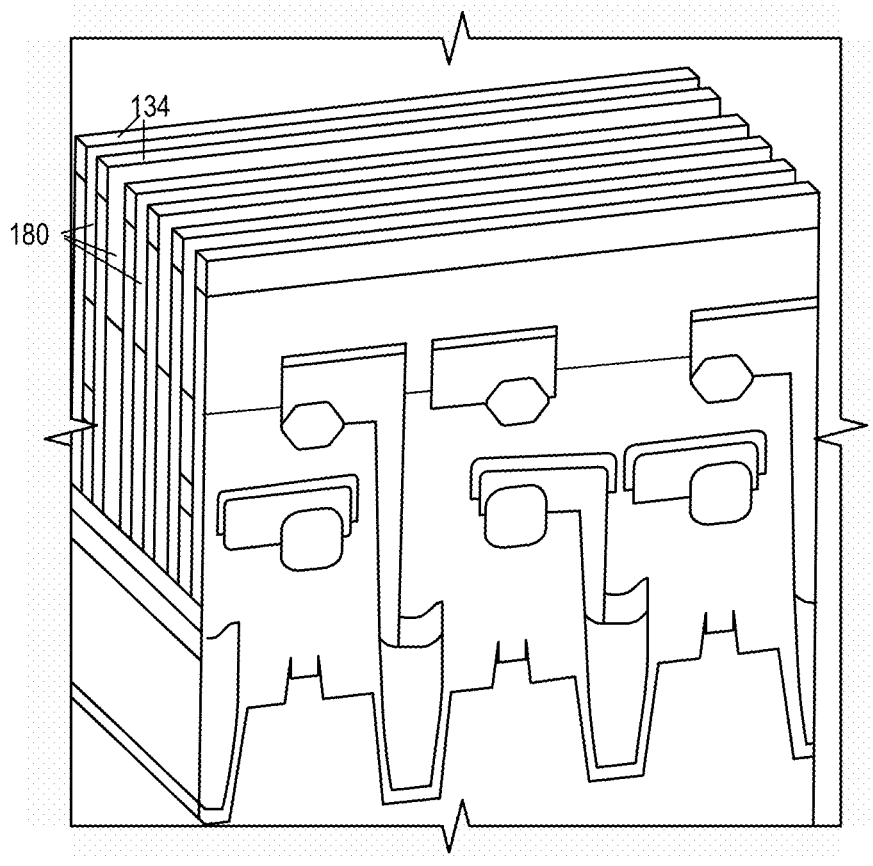

In FIG. 14B, a first layer 112' of the top dielectric cap 112 can be selectively deposited on the top portion of the top S/D contacts. In another example, the first layer 112' can be formed by a deposition/CMP/recess etch process. Once the first layer 112' of the top dielectric cap 112 is in place, the PMD layer 132 can be recessed again so that the side portions of the top S/D contacts can be exposed through an sixth etching process by using the first layer 112' as a stopping layer. In an embodiment, the sixth etching process recesses the PMD layer and exposes the TaN liner that formed on the side portions of the top S/D contacts. In another embodiment, the sixth etching process can further remove the liner material, such as the TaN, from the side portions of the top S/D contacts and expose the metal layer, such as ruthenium. In some embodiments, the sixth etching process can include a direct etch followed by an atomic layer etch or quasi-atomic layer etch so as to more precisely define a final depth of the top S/D contact. In some embodiments, the sixth etching process can incorporate a vapor-phase cyclic etch of the oxide or replacement contact material (chemical oxide removal or like process).

Figure 15A:
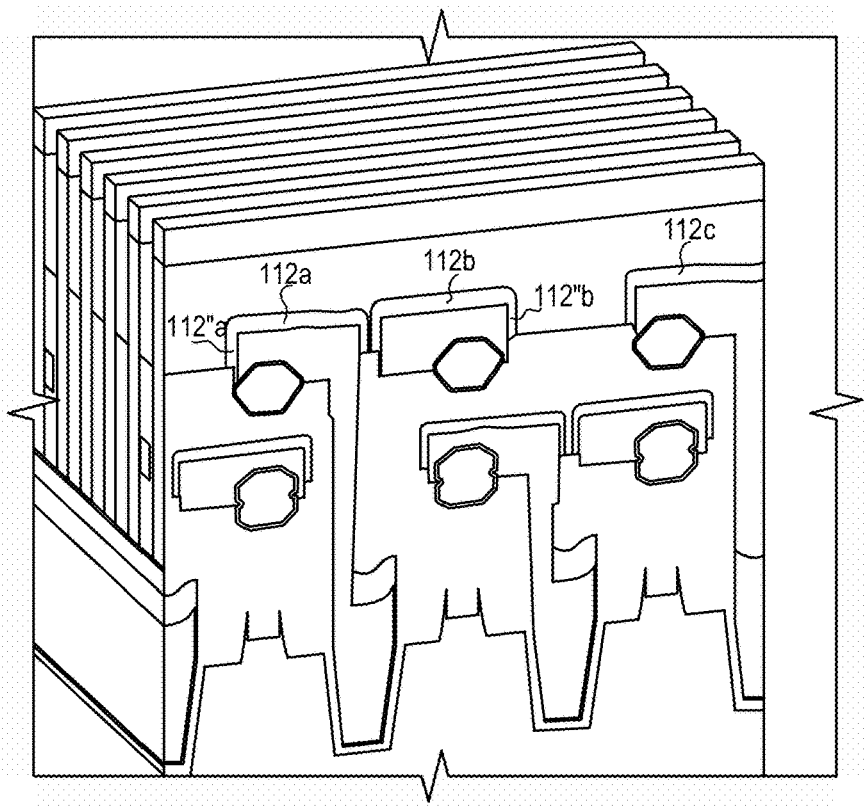

In FIG. 15A, a second layer 112" can be formed over the first layer 112'. The second layer can further cover the side portions of the top S/D contacts. The second layer can include SiO, SiC, SiN, SiOC, SICN, SiOCN, an organic-based material, or the like. As shown in FIG. 15A, when the second layer 112" is deposited, the top dielectric caps 112 are formed.

Figure 15B:
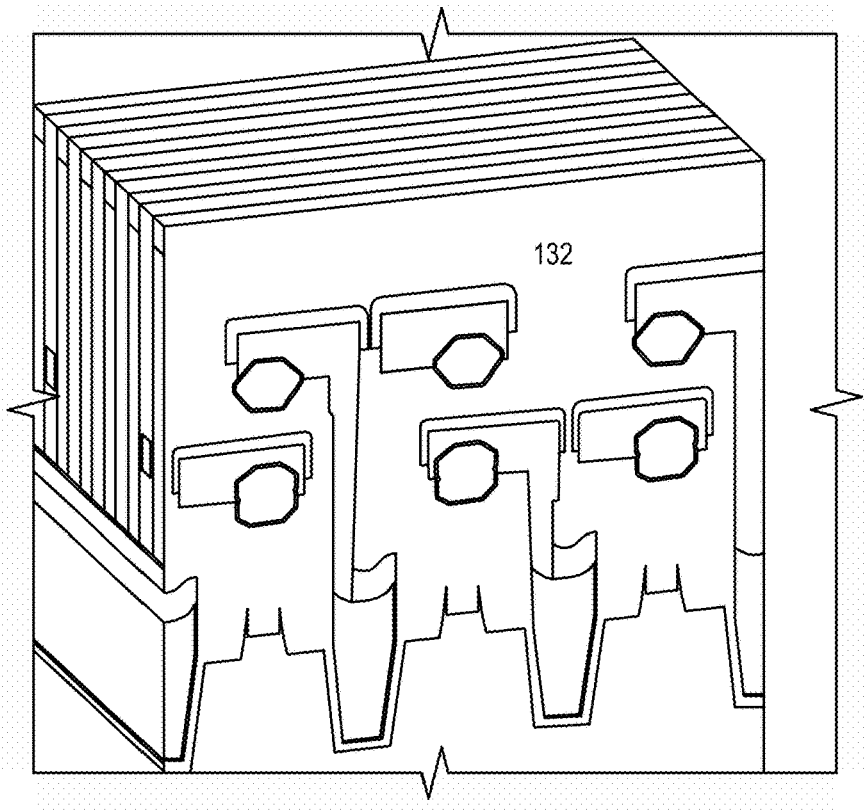
Figure 15C:
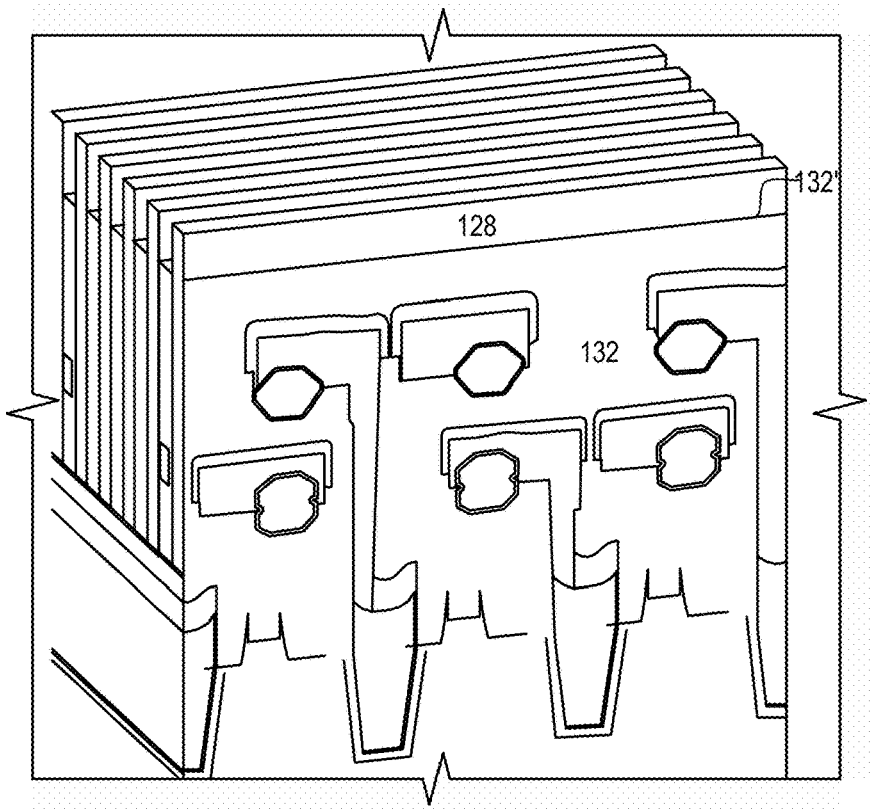

In FIG. 15B, gaps 180 that are formed by the sixth etching process can be filled with oxide to form a complete PMD layer 132. In some embodiments, a surface planarization process, such as a CMP process, can be applied to remove excessive oxide over the nitride caps 144. In FIG. 15C, once the CMP is finished, the PMD layer 132 can be recessed down in order to make a room for the etch selective cap (i.e., 134). In some embodiments, after the recess, a top surface 132' of the PMD layer 132 can be positioned above the top dielectric caps 112. The etch selective cap (i.e., 134) can serve as an etch selective global S/D region cap which can be applied to provide a self-alignment between the via-to-drain structures and the S/D contacts. The etch selective cap can prevent the via-to-drain structures from either being inadvertently open or being short to the metal gates. Vice-versa, the etch selective cap can prevent via-to-gate structures from inadvertently being open or being short to any of the tiered S/D contacts.

It should be noted that, when the PMD layer 132 is recessed to leave a space for deposition of the etch selective cap 134, the replacement gates 140 can be converted to the high-k/metal gate by removing the replace gates, and depositing a high-k layer followed by a metal gate layer.

Figure 16A:
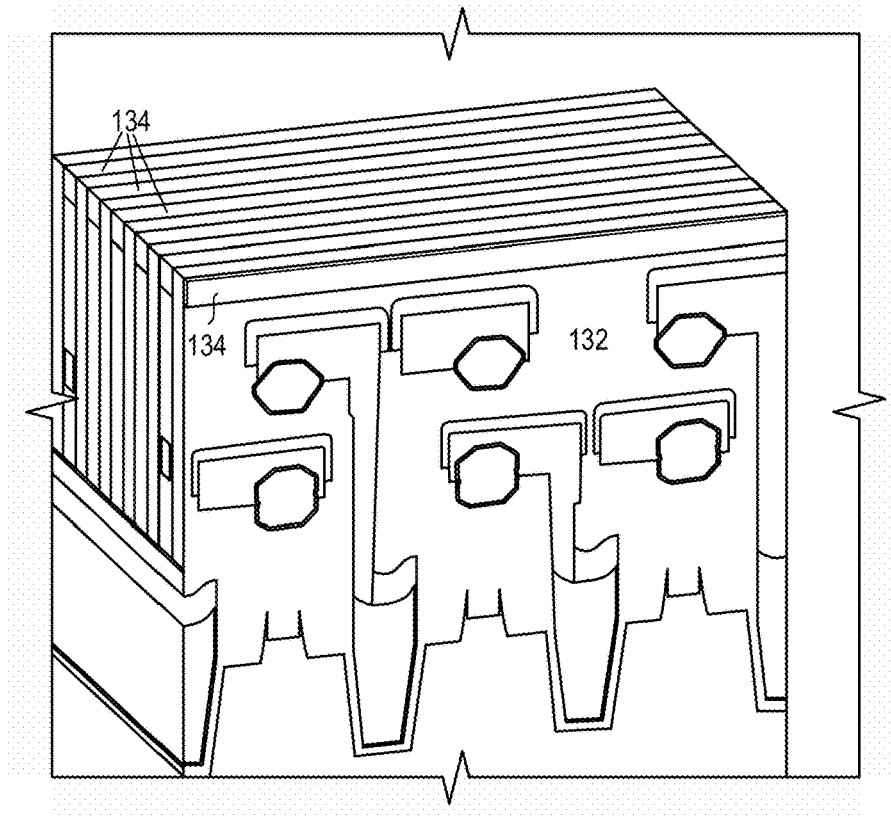
Figure 16B:
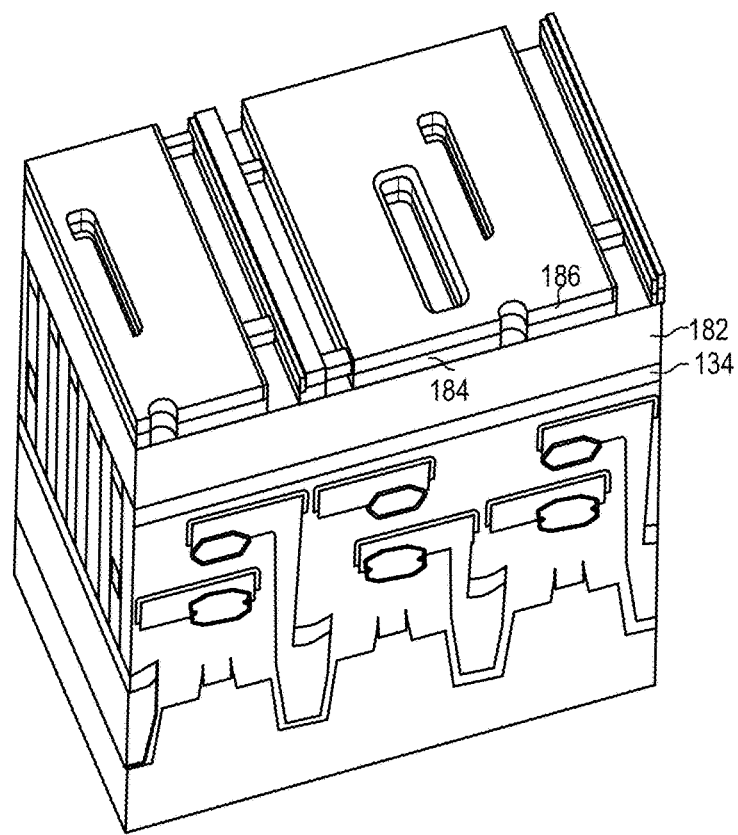
Figure 16C:
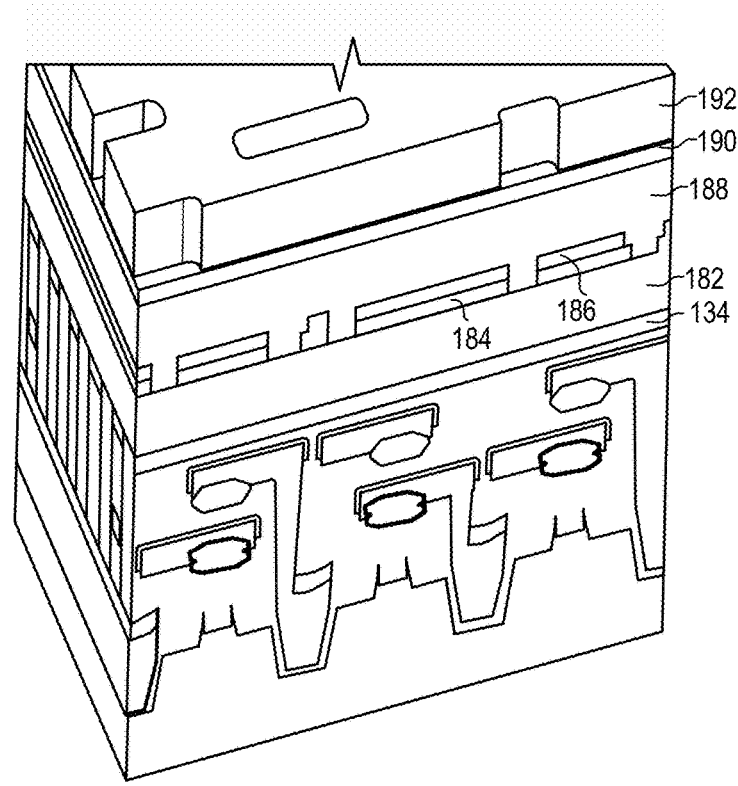
Figure 17A:
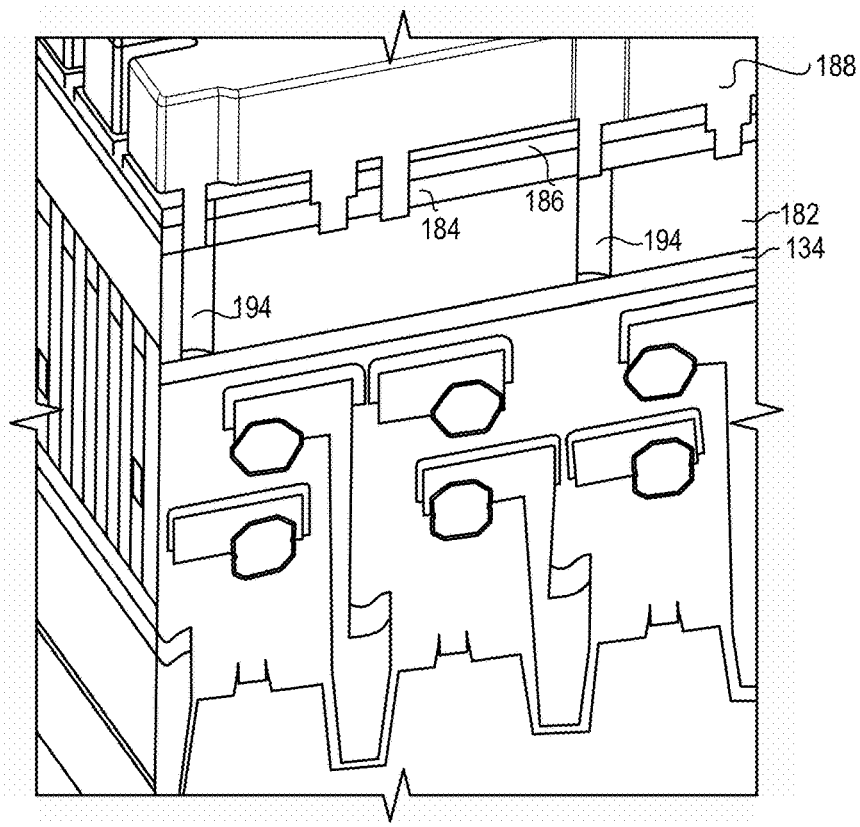

In FIG. 16A, the etch selective cap 134 can be formed in the recessed portion of the PMD layer 132. In FIG. 16B, a fifth hard mask stack that includes a first oxide layer 182, and a hard mask layer 184, and second oxide layer 186 can be formed and patterned. The patterns formed on the fifth hard mask stack can be used to form the initial metal layer (i.e., MO) openings. In FIG. 16B, a sixth hard mask stack that includes a spin on carbon layer 188, a SiON layer 190, and a photoresist layer 192 can be formed and patterned over the fifth hard mask stack. The patterns formed on the sixth hard mask stack can be used to form the via-to-drain openings. In FIG. 17A, a seventh etching process, such as a dry etch process, can be applied to transfer the patterns of via-to-drain opening from the sixth hard mask into the first oxide layer 182 to form a plurality of via to drain openings 194. The via-to-drain opening 194 can stop on the etch selective cap 134.

Figure 17B:
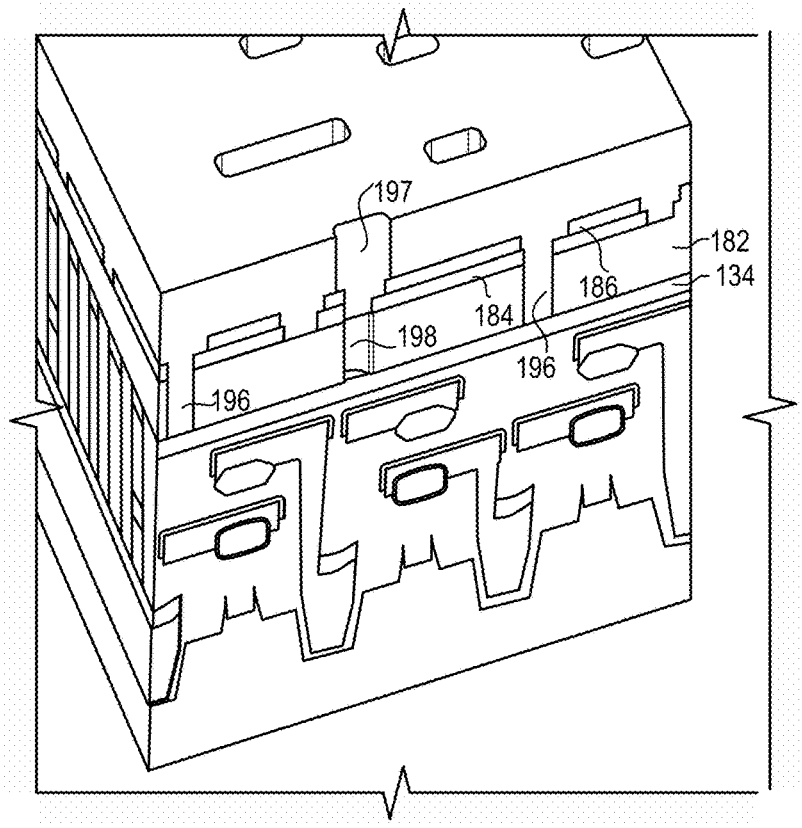

In FIG. 17B, a layer of spin on carbon 196 can be deposited over the surface of the sixth hard mask stack. The spin on carbon layer 196 can fill in the via-to-drain openings 194. Further, a photo lithography process can be applied to form a plurality of via patterns 197 on the spin on carbon layer 196. The via patterns 197 can be subsequently transferred to the first oxide layer 182 through an etching process to form a plurality of via-to-drain openings 198.

Figure 17C:
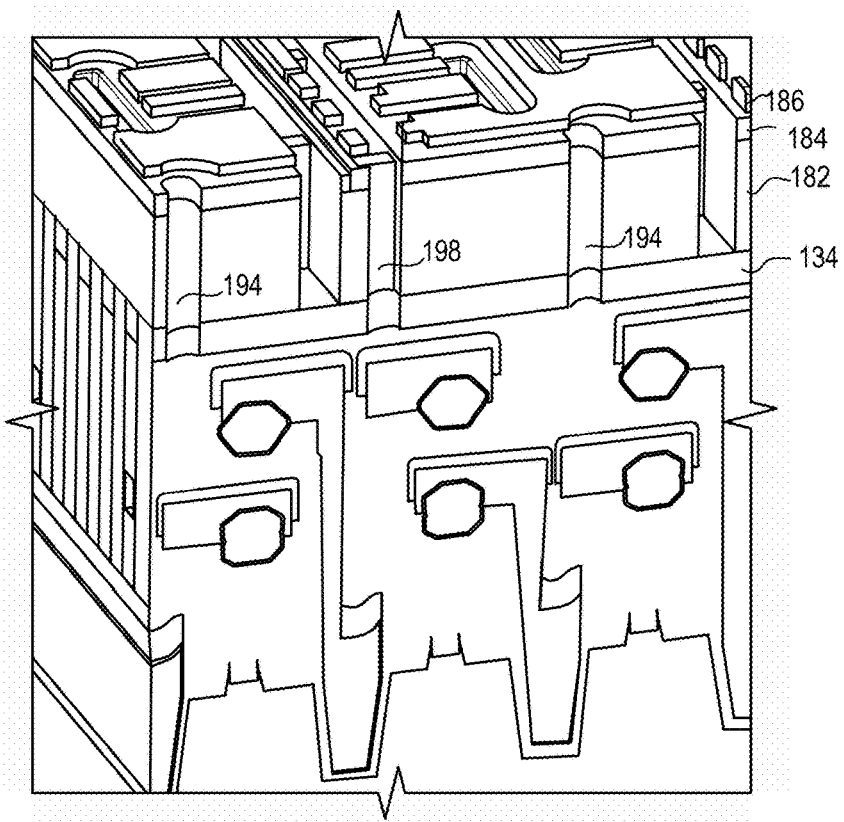

In FIG. 17C, the spin on carbon layer 196 and the sixth hard mask stack (i.e., 188, 190, and 192) can be removed by an etching process, and an eighth etching process can be applied to extend the via-to-drain openings 194 and 198 so that the via-to-drain openings 194 and 198 can pass through the etch selective cap 134. In some embodiments, when the eighth etching process is completed, only the fifth hard mask stack (i.e., 182,184, and 186) remains.

Figure 18A:
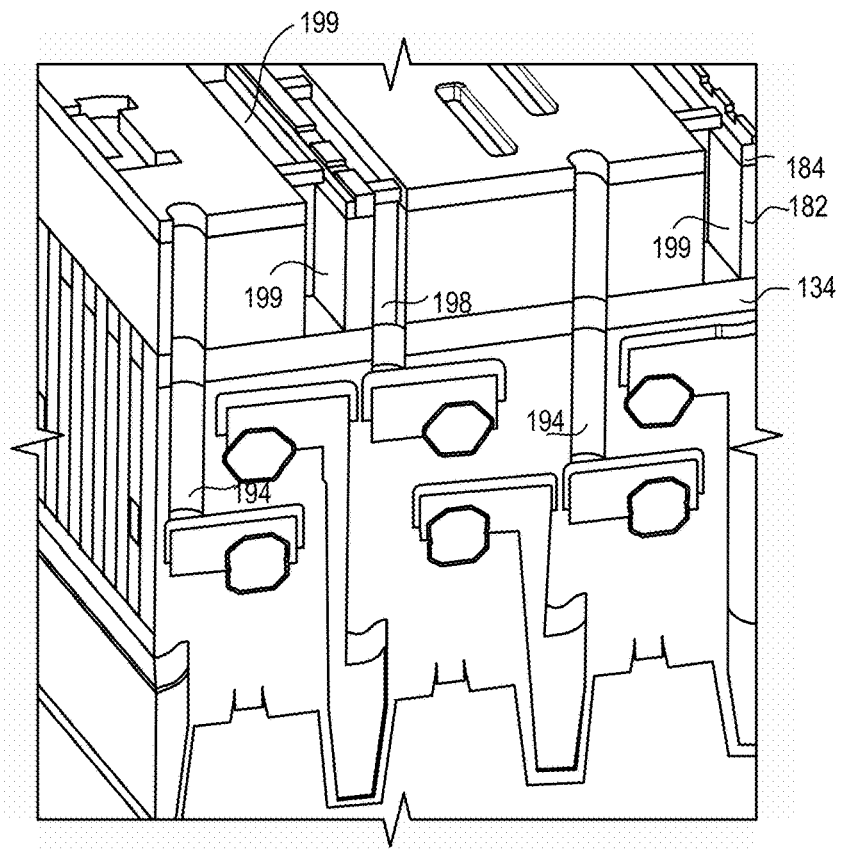
Figure 18B:
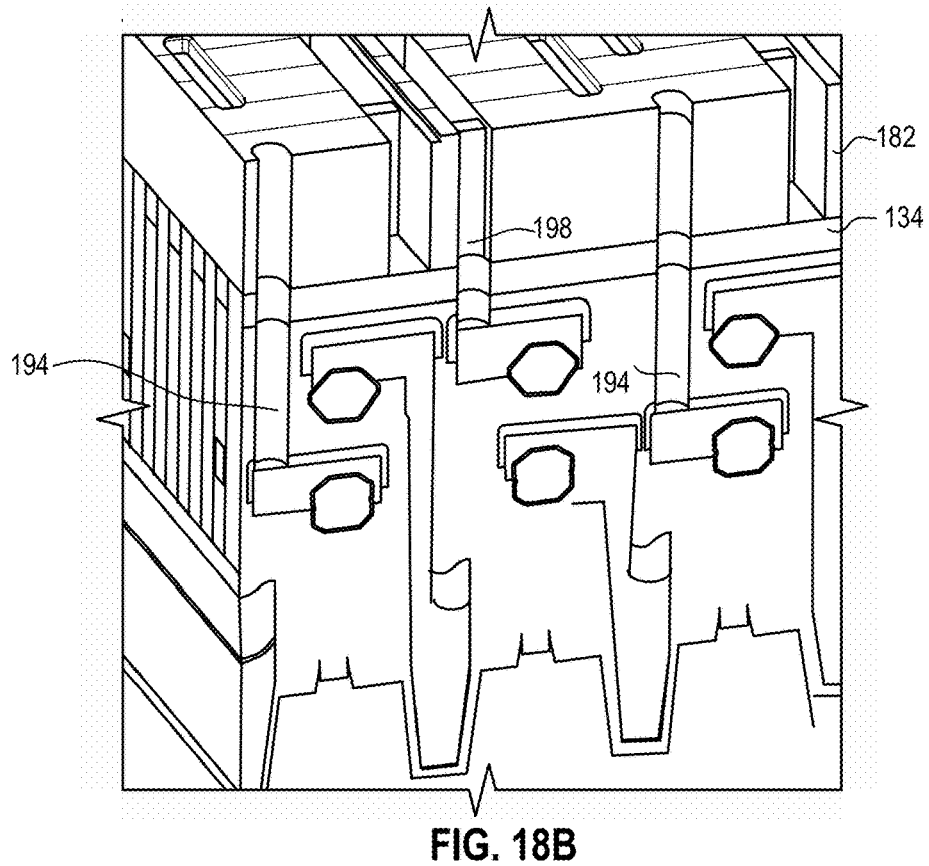

In FIG. 18A, a ninth etching process can be applied that transfers the patterns in the fifth hard mask down in the PMD layer 132. After the ninth etching process, the via-to-drain openings 194 and 198 can further extend into the PMD layer 132 and stop on the top and bottom dielectric caps. In addition, a plurality of initial metal layer (i.e., MO) openings 199 can be formed after the ninth etching process. In FIG. 18B, a punch process can be applied to extend the via-todrain openings 194 and 198 pass through the top and bottom dielectric caps. When the punch process is completed, only the first oxide layer 182 remains.

Figure 18C:
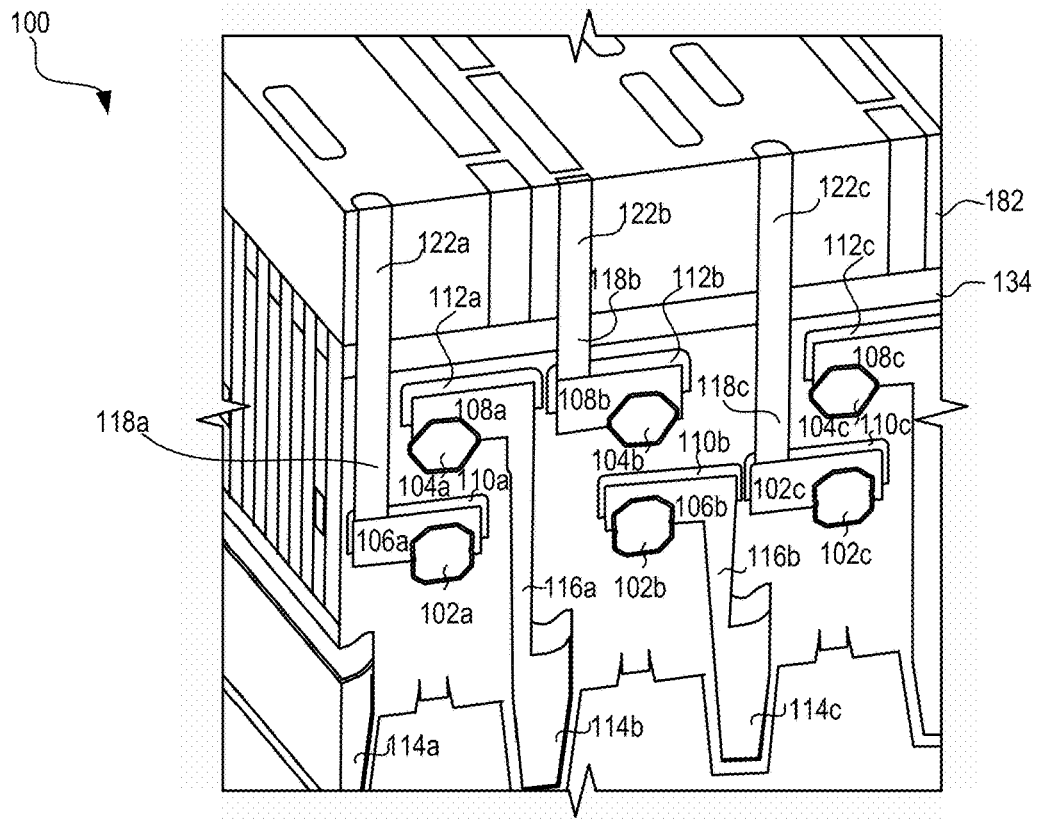

In FIG. 18C, a metal layer, such as tungsten or copper, can be formed in the via-to-drain openings 194 and 198, and the initial metal layer openings 199. A subsequent surface planarization process can be applied to remove excessive metal layer. When the surface planarization process is completed, a semiconductor device that is identical to the device 100 can be formed.

Figure 19:
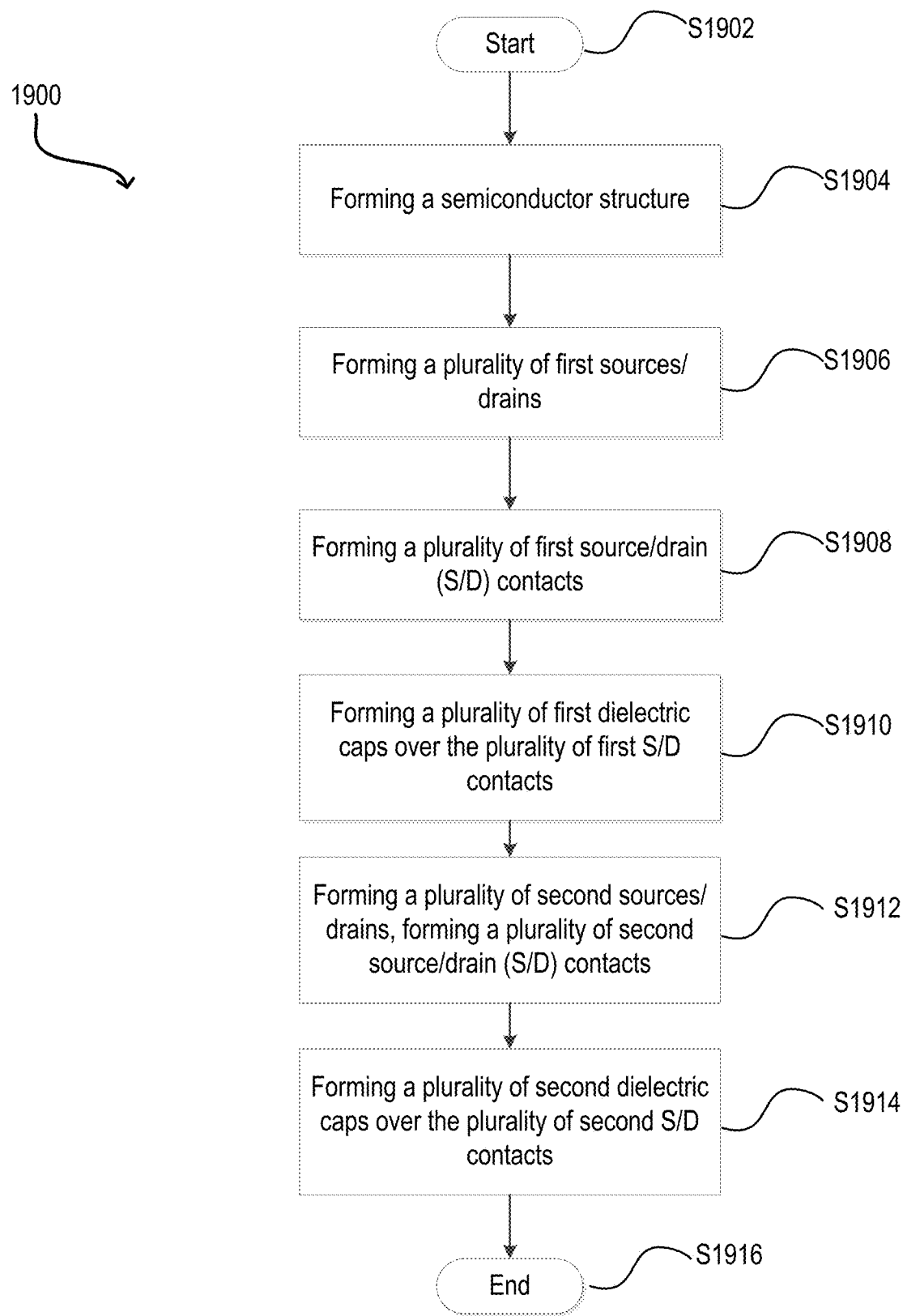
FIG. 19 is a flowchart of a process for manufacturing the 3D CFET device, in accordance with some embodiments.

FIG. 19 is a flowchart of a process 1900 for manufacturing a 3D CFET device. The process 1900 begins at step 1904 where a semiconductor structure is formed. The semiconductor structure can include a first channel structure, a second channel structure, and a plurality of power rails. The plurality of power rails can be positioned below the first channel structure to form a stair-case configuration. The second channel structure can be formed over the first channel structure. The first and second channel structures extend along a length direction of the plurality of power rails. In some embodiments, steps 1904 can be performed as illustrated with reference to FIG. 7A.

The process 1900 then proceeds to step 1906 where a plurality of first sources/drains can be formed. The plurality of first sources/drains can surround the first channel structure, and be embedded in a first dielectric layer, such as a PMD layer. In some embodiments, steps 1906 can be performed as illustrated with reference to FIGS. 7B-8C.

The process 1900 proceeds to step 1908 where a plurality of first source/drain (S/D) contacts can be formed. Each of the plurality of first S/D contacts can be formed over a respective first source/drain, and have a bar shape with a top portion, a bottom portion and side portions so that the bottom portion covers the respective first source/drain. In some embodiments, steps 1908 can be performed as illustrated with reference to FIGS. 9A-10B.

In step 1910 of the process 1900, a plurality of first dielectric caps can be formed over the plurality of first S/D contacts. Each of the plurality of first dielectric caps can be positioned over a respective first S/D contact to cover the top portion and at least a part of the side portions of the respective first S/D contact. In some embodiments, steps 1910 can be performed as illustrated with reference to FIGS. 10C-11C.

The process 1900 then proceeds to step 1912, where a plurality of second sources/drains can be formed and a plurality of second source/drain (S/D) contacts can be formed over the second sources/drains. The plurality of second sources/drains can be positioned over the plurality of first sources/drains, surround the second channel structure, and be embedded in a second dielectric layer, such as a PMD layer. Each of the plurality of second S/D contacts can be formed over a respective second source/drain, and have a bar shape with a top portion, a bottom portion and side portions so that the bottom portion covers the respective second source/drain. In some embodiments, steps 1912 can be performed as illustrated with reference to FIGS. 12A-14A.

The process 1900 further proceeds to step 1914 where a plurality of second dielectric caps can be formed over the plurality of second S/D contacts. Each of the plurality of second dielectric caps can positioned over a respective second S/D contact to cover the top portion and at least a part of the side portions of the respective second S/D contact. In some embodiments, steps 1914 can be performed as illustrated with reference to FIGS. 14B-15B.

The process 1900 can further includes steps to form an initial metal layer, and a plurality of via-to-drain structures. In some embodiments, the steps forming the initial metal layer, and the plurality of via-to-drain structures can be performed as illustrated with reference to FIGS. 15C-18C.

In the present disclosure, the sidewall dielectric along the lateral faces of the S/D contacts directs the via-to-drain structures and provides an additional means of self-alignment when the via-to-drain structures are transferred down to the intended (targeted) tiered S/D contact. Once each of the dielectric caps is opened and connections are made, all via-to-drain structures and the initial metal layer can be metalized at the same time. In an example of the process 1900, via-to-gate structures can be introduced to connect the gate structures and a second metal layer, rather than connect the gates structures and the initial metal layer. If the via-to-gate structures are required to connect to the initial metal layer, a plug process using a spin-on organic film is optionally used to allow the via-to-gate structure to be executed either prior to or following the via-to-drain connections.

It should be noted that additional steps can be provided before, during, and after the process 1900, and some of the steps described can be replaced, eliminated, or performed in different order for additional embodiments of the process 1900. In subsequent process steps, various additional interconnect structures (e.g., metallization layers having conductive lines and/or vias) may be formed over the semiconductor device 100. Such interconnect structures electrically connect the semiconductor device 100 with other contact structures and/or active devices to form functional circuits. Additional device features such as passivation layers, input/output structures, and the like may also be formed.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A semiconductor device, comprising:
   a plurality of first source/drain (S/D) contacts and a plurality of first sources/drains, each of the plurality of first S/D contacts being formed over a respective first source/drain, and having a bar shape with a top portion, a bottom portion and side portions so that the bottom portion covers the respective first source/drain;
   a plurality of first dielectric caps formed over the plurality of first S/D contacts, each of the plurality of first dielectric caps being positioned over a respective first S/D contact to cover the top portion and at least a part of the side portions of the respective first S/D contact;
   a plurality of second S/D contacts and a plurality of second sources/drains that are positioned over the plurality of first S/D contacts, each of the plurality of second S/D contacts being formed over a respective second S/D, and having a bar shape with a top portion, a bottom portion and side portions so that the bottom portion covers the respective second source/drain, the plurality of second S/D contacts being staggered over the plurality of first S/D contacts to form a stair-case configuration; and
   a plurality of second dielectric caps formed over the plurality of second S/D contacts, each of the plurality of second dielectric caps being positioned over a respective second S/D contact to cover the top portion and at least a part of the side portions of the respective second S/D contact.

2. The semiconductor device of claim 1, wherein each of the plurality of first dielectric caps covers the side portions of the respective first S/D contact fully.

3. The semiconductor device of claim 1, wherein each of the plurality of second dielectric caps covers the side portions of the respective second S/D contact fully.

4. The semiconductor device of claim 1, wherein each of the plurality of first dielectric caps comprises a bottom layer positioned on the top portion of the respective first S/D contact and a top layer formed over the bottom layer to cover the top portion and the side portions of the respective first S/D contact.

5. The semiconductor device of claim 1, wherein each of the plurality of second dielectric caps comprises a bottom layer positioned on the top portion of the respective second S/D contact and a top layer formed over the bottom layer to cover the top portion and the side portions of the respective second S/D contact.

6. The semiconductor device of claim 1, further comprising:
   a plurality of power rails that are buried in a substrate and arranged below the plurality of the first S/D contacts so as to form a stair-case configuration, wherein:
   at least one of the plurality of first S/D contacts being connected to a first power rail of the plurality of power rails through a first via-to-rail structure, and
   at least one of the plurality of second S/D contacts being connected to a second power rail of the plurality of power rails through a second via-to-rail structure.

7. The semiconductor device of claim 6, further comprising:
   a plurality of third dielectric caps formed over the plurality of power rails, each of the plurality of third dielectric caps being formed over a respective power rail, the first via-to-rail structure passing through a first one of the third dielectric caps that is formed over the first power rail, the second via-to-rail structure passing through a second one of the third dielectric caps that is formed over the second power rail.

8. The semiconductor device of claim 6, further comprising:
   a plurality of via-to-drain structures, the plurality of first S/D contacts and the plurality of second S/D contacts being stair-cased so that at least one of the plurality of via-to-drain structures passes through a first dielectric cap to connect to one of the plurality of first S/D contacts, and at least another one of the plurality of via-to-drain structures passes through a second dielectric cap to connect to one of the plurality of second S/D contacts; and
   a plurality of metal lines, the plurality of the metal lines being electrically coupled with the plurality of via-to-drain structures.

9. The semiconductor device of claim 8, wherein each of the plurality of first dielectric caps is configured to separate the respective first S/D contact from at least one of an adjacent first S/D contact, an adjacent via-to-drain structure, an adjacent first via-to-rail structure, and an adjacent second via-to-rail structure.

10. The semiconductor device of claim 8, wherein each of the plurality of second dielectric caps is configured to separate the respective second S/D contact from at least one of an adjacent second S/D contact, an adjacent via-to-drain structure, and an adjacent second via-to-rail structure.

11. The semiconductor device of claim 6, further comprising:
    a first channel structure formed along a length direction of one of the power rails;
    second channel structure formed along the length direction of the one of the power rails; and
    a plurality of gate structures, wherein:
    the plurality of gate structures surround the first channel structure and the second channel structure,
    the plurality of first sources/drains surround the first channel structure,
    the plurality of second sources/drains surround the second channel structure,
    the plurality of gate structures and the plurality of first sources/drains are spaced apart from each other by a plurality of low-K spacers, and disposed alternatively, and
    the plurality of gate structures and the plurality of second sources/drains are spaced apart from each other by the plurality of low-K spacers, and disposed alternatively.

12. A method for manufacturing a semiconductor device, comprising:
    forming a semiconductor structure, the semiconductor structure including a first channel structure, a second channel structure, and a plurality of power rails buried in a substrate, the plurality of power rails being positioned below the first channel structure to form a stair-case configuration, the second channel structure being formed over the first channel structure, the first and second channel structures extending along a length direction of the plurality of power rails;

forming a plurality of first sources/drains, the plurality of first sources/drains surrounding the first channel structure, and being embedded in a first dielectric layer;

forming a plurality of first source/drain (S/D) contacts, each of the plurality of first S/D contacts being formed over a respective first source/drain, and having a bar shape with a top portion, a bottom portion and side portions so that the bottom portion covers the respective first source/drain;

forming a plurality of first dielectric caps over the plurality of first S/D contacts, each of the plurality of first dielectric caps being positioned over a respective first S/D contact to cover the top portion and at least a part of the side portions of the respective first S/D contact;

forming a plurality of second sources/drains, the plurality of second sources/drains being positioned over the plurality of first sources/drains and surrounding the second channel structure, and being embedded in a second dielectric layer;

forming a plurality of second source/drain (S/D) contacts, each of the plurality of second S/D contacts being formed over a respective second source/drain, and having a bar shape with a top portion, a bottom portion and side portions so that the bottom portion covers the respective second source/drain, the plurality of second S/D contacts being staggered over the plurality of first S/D contacts to form a stair-case configuration; and forming a plurality of second dielectric caps over the plurality of second S/D contacts, each of the plurality of second dielectric caps being positioned over a respective second S/D contact to cover the top portion and at least a part of the side portions of the respective second S/D contact.

13. The method of claim 12, wherein forming the plurality of first source/drain (S/D) contacts further comprises:
forming a plurality of first dual damascene openings in the first dielectric layer to expose the plurality of first sources/drains, and at least one of the plurality of power rails; and
forming the plurality of first S/D contacts in the first dual damascene openings and at least a first via-to-rail structure, each of the plurality of first S/D contacts being formed over a respective first source/drain, and having a bar shape with a top portion, a bottom portion and side portions so that the bottom portion covers the respective first source/drain, at least one of the plurality of first S/D contacts being connected to one of plurality of power rails through the first via-to rail structure.

14. The method of claim 13, wherein forming the plurality of first dielectric caps over the plurality of first S/D contacts further comprises:
forming a plurality of bottom dielectric layers over the top portions of the plurality of first S/D contacts, each of the plurality of bottom dielectric layers being positioned on the top portion of a respective first S/D contact;
filling the plurality of first dual damascene openings with a third dielectric layer;
recessing the first dielectric layer and the third dielectric layer to expose the top portions and side portions of the plurality of first S/D contacts; and
forming a plurality of top dielectric layers over the plurality of bottom dielectric layers, each of the plurality of top dielectric layers being positioned over a respective bottom dielectric layer to cover the top portion and the side portions of the respective first S/D contact.

15. The method of claim 12, wherein forming the plurality of second source/drain (S/D) contacts further comprises:
forming a plurality of second dual damascene openings in the second dielectric layer to expose the plurality of second sources/drains, and at least one of the plurality of power rails; and
forming the plurality of second S/D contacts in the second dual damascene openings and at least a second via-to-rail structure, each of the plurality of second S/D contacts being formed over a respective second source/drain, and having a bar shape with a top portion, a bottom portion and side portions so that the bottom portion covers the respective second source/drain, at least one of the plurality of second S/D contacts being connected to one of plurality of power rails through the second via-to rail structure.

16. The method of claim 15, wherein forming the plurality of second dielectric caps over the plurality of second S/D contacts further comprises:
forming a plurality of bottom dielectric layers over the top portions of the plurality of second S/D contacts, each of the plurality of bottom dielectric layers being positioned on the top portion of a respective second S/D contact;
recessing the second dielectric layer to expose the side portions of the plurality of second S/D contacts; and
forming a plurality of top dielectric layers over the plurality of bottom dielectric layers, each of the plurality of top dielectric layers being positioned over a respective bottom dielectric layer to cover the top portion and the side portions of the respective second S/D contact.

17. The method of claim 12, further comprising:
forming a plurality of gate structures, wherein:
the plurality of gate structures surround the first channel structure and the second channel structure,
the plurality of gate structures and the plurality of first sources/drains are spaced apart from each other by a plurality of low-K spacers, and disposed alternatively, and
the plurality of gate structures and the plurality of second sources/drains are spaced apart from each other by the plurality of low-K spacers, and disposed alternatively.

18. A semiconductor device, comprising:
a substrate;
a plurality of power rails buried in the substrate;
a plurality of first sources/drains formed over the plurality of power rails so as to form a stair-case configuration;
a plurality of first source/drain (S/D) contacts formed over the plurality of first sources/drains, each of the plurality of first S/D contacts being formed over a respective first source/drain, and having a bar shape with a top portion, a bottom portion and side portions so that the bottom portion covers the respective first source/drain;
a plurality of first dielectric caps formed over the plurality of first S/D contacts, each of the plurality of first dielectric caps being positioned over a respective first S/D contact to cover the top portion and at least a part of the side portions of the respective first S/D contact so as to separate the respective first S/D contact from at least one of an adjacent first S/D contact, an adjacent via-to-drain structure, an adjacent first via-to-rail structure, and an adjacent second via-to-rail structure;

a plurality of second sources/drains formed over the plurality of first sources/drains to form a stair-case configuration;

a plurality of second source/drain (S/D) contacts formed over the plurality of second sources/drains, each of the plurality of second S/D contacts being formed over a respective second source/drain, and having a bar shape with a top portion, a bottom portion and side portions so that the bottom portion covers the respective second source/drain, the plurality of second S/D contacts being staggered over the plurality of first S/D contacts to form a stair-case configuration; and a plurality of second dielectric caps formed over the plurality of second S/D contacts, each of the plurality of second dielectric caps being positioned over a respective second S/D contact to cover the top portion and at least a part of the side portions of the respective second S/D contact so as to separate the respective second S/D contact from at least one of an adjacent second S/D contact, an adjacent via-to-drain structure, and an adjacent second via-to-rail structure, wherein at least one of the plurality of first S/D contacts being connected to a first power rail of the plurality of power rails through a first via-to-rail structure, and at least one of the plurality of second S/D contacts being connected to a second power rail of the plurality of power rails through a second via-to-rail structure.

19. The semiconductor device of claim 18, further comprising:

a plurality of via-to-drain structures, the plurality of first S/D contacts and the plurality of second S/D contacts being stair-cased so that at least one of the plurality of via-to-drain structures passes through one of the first dielectric caps to connect to one of the plurality of first S/D contacts, and at least another one of the plurality of via-to-drain structures passes through one of the second dielectric caps to connect to one of the plurality of second S/D contacts; and a plurality of metal lines, the plurality of the metal lines being electrically coupled with the plurality of via-to-drain structures.

20. The semiconductor device of claim 18, further comprising:

a first channel structure formed along a length direction of one of the power rails;

a second channel structure formed along the length direction of the one of the power rails; and a plurality of gate structures, wherein:

the plurality of gate structures surround the first channel structure and the second channel structure, the plurality of first sources/drains surround the first channel structure, the plurality of second sources/drains surround the second channel structure, the plurality of gate structures and the plurality of first sources/drains are spaced apart from each other by a plurality of low-K spacers, and disposed alternatively, and the plurality of gate structures and the plurality of second sources/drains are spaced apart from each other by the plurality of low-K spacers, and disposed alternatively.

* * * * *

UNITED STATES PATENT AND TRADEMARK OFFICE
CERTIFICATE OF CORRECTION

PATENT NO. : 10,770,479 B2  
APPLICATION NO. : 16/357893  
DATED : September 8, 2020  
INVENTOR(S) : Smith et al.

Page 1 of 1

It is certified that error appears in the above-identified patent and that said Letters Patent is hereby corrected as shown below:

In the Claims

In Column 24, Claim 11, Line 43, delete "second channel" and insert --a second channel--

Signed and Sealed this
Twenty-sixth Day of October, 2021

Drew Hirshfeld
*Performing the Functions and Duties of the*
*Under Secretary of Commerce for Intellectual Property and*
*Director of the United States Patent and Trademark Office*